(12) United States Patent
Tanuma et al.

(10) Patent No.: US 7,450,434 B2
(45) Date of Patent: Nov. 11, 2008

(54) SEMICONDUCTOR DEVICE AND ITS CONTROL METHOD

(75) Inventors: Yasuhiko Tanuma, Musashino (JP); Kazuhiro Kurihara, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 181 days.

(21) Appl. No.: 11/127,713

(22) Filed: May 12, 2005

(65) Prior Publication Data
US 2005/0254299 A1 Nov. 17, 2005

Related U.S. Application Data

(63) Continuation of application No. PCT/JP2004/006375, filed on May 12, 2004.

(51) Int. Cl.
*G11C 11/34* (2006.01)
(52) U.S. Cl. .................. 365/185.29; 365/185.23; 365/185.11
(58) Field of Classification Search ............ 365/185.29, 365/185.23, 185.11, 185.13, 230.06, 130.06
See application file for complete search history.

(56) References Cited

U.S. PATENT DOCUMENTS

| | | | |
|---|---|---|---|
| 5,532,971 A * | 7/1996 | Tanaka et al. ......... | 365/230.06 |
| 5,619,450 A * | 4/1997 | Takeguchi ............. | 365/185.23 |
| 6,064,623 A * | 5/2000 | Ha ....................... | 365/230.06 |
| 6,233,198 B1 | 5/2001 | Choi ..................... | 365/230.06 |
| 6,463,004 B2 * | 10/2002 | Guliani et al. ......... | 365/230.03 |
| 6,665,229 B2 * | 12/2003 | Lee et al. .............. | 365/230.06 |
| 6,989,562 B2 * | 1/2006 | Georgescu ................ | 257/315 |
| 2002/0097630 A1 | 7/2002 | Aritomi et al. ......... | 365/230.03 |
| 2003/0002337 A1 * | 1/2003 | Jeong ................... | 365/185.11 |
| 2003/0094971 A1 | 5/2003 | Harada ..................... | 326/81 |

FOREIGN PATENT DOCUMENTS

| | | |
|---|---|---|
| JP | 9162373 | 6/1997 |
| JP | 2001-43693 A | 2/2001 |
| JP | 2001-126475 | 5/2001 |
| JP | 2003-77283 | 3/2003 |
| JP | 2003-157688 A | 5/2003 |
| WO | WO 03/021603 A1 | 3/2003 |

* cited by examiner

*Primary Examiner*—Dang T Nguyen

(57) ABSTRACT

A semiconductor device includes sectors having memory cells connected to local word lines, decoders selecting the sectors, and a circuit generating, in erasing of a selected sector, a control signal that causes a corresponding one of the decoders associated with the selected sector to be temporarily unselected. Each of the sectors includes a pull-up transistor that is driven by a corresponding one of the decoders via a corresponding one of global word lines connecting the sectors and drives one of the local word lines, and the pull-up transistor is kept OFF by the control signal.

7 Claims, 20 Drawing Sheets

Fig. 2A

GLOBAL WORD LINE DECODER (xdec) 140

|  | ERASE VERIFY | ERASE | PROGRAM |
|---|---|---|---|
| GWLNh (SELECTED) | VPX | NEGP | VPX |
| GLWBh (SELECTE) | Vss | Vss | Vss |
| GWLNh (SELECTED) | Vss | Vss | Vss |
| GLWBh (UNSELECTED) | Vcc | Vcc | Vcc |

Fig. 2B

VERTICAL WORD LINE DECODER (vxdec) 340

|  | ERASE VERIFY | ERASE | PROGRAM |
|---|---|---|---|
| VWLv (SELECTED) | VPXV | Vss | VPXV |
| VWLv (UNSELECTED) | Vss | Vss | Vss |

Fig. 2C

SELECTOR SWITCH CONTROL CIRCUIT (sswitch) 210

|  | ERASE VERIFY | ERASE | PROGRAM |
|---|---|---|---|
| XDSn (SELECTED) | Vss | NEGP | Vss |
| XDSn (UNSELECTED) | Vss | Vss | Vss |

Fig. 2D

LOCAL WORD DECODER (xdec_sub) 240

|  |  | ERASE VERIFY | PROGRAM | ERASE |  |
|---|---|---|---|---|---|
| SELECTED WORD LINE | GWLNh | VPXh | VPXh |  | GWLNh | NEGP |
|  | GWLNBh | Vss | Vss |  | GWLBh | Vss |
|  | VWLv | VPXV | VPXV | SELECTED SECTOR | VWLv | Vss |
|  | P2WLn | HIGH VOLTAGE | HIGH VOLTAGE |  | XDSn | NEGP |
|  | GWLNh | VPXh/Vss | VPXh/Vss |  | GXDSh | NEGP |
| UNSELECTED WORD LINE | GWLNBh |  |  |  | P2WLn | NEGATIVE VOLTAGE |
|  | VWLv | Vss/Vcc | Vss/Vcc(Vss) | UNSELECTED SECTOR | GWLNh | NEGP/Vss |
|  | XDSn | Vss/VPXV | Vss/VPXV |  | GWLBh | Vss/Vcc |
|  | P2WLn | Vss/Vss | Vss/Vss |  | VWLv | Vss/Vss |
|  |  | (a) / (b) | (a) / (b) |  | XDSn | Vss/Vss |
|  |  |  |  |  | GXDSh |  |
|  |  |  |  |  | P2WLn | Vss/Vss |
|  |  |  |  |  |  | (a) / (b) |

(a) SELECT GLOBAL WORD LINE & UNSELECT VERTICAL WORD LINE
(b) UNSELECT GLOBAL WORD LINE & SELECT VERTICAL WORD LINE

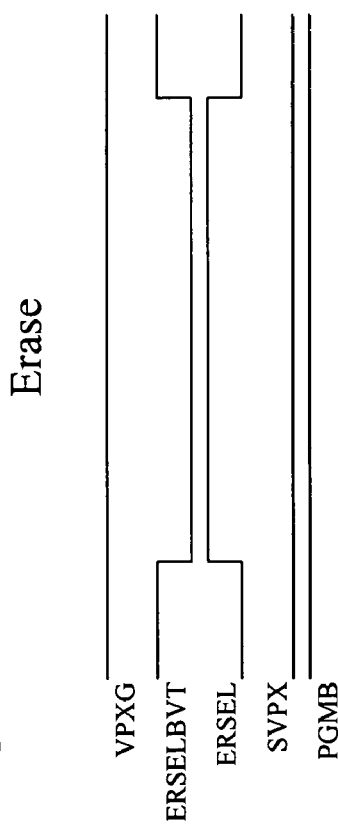
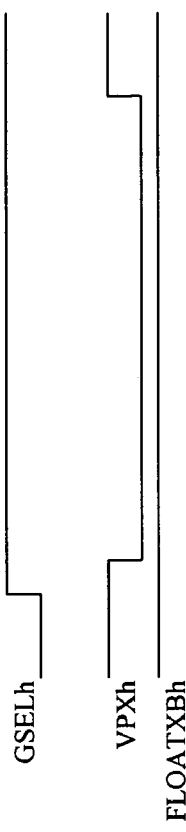
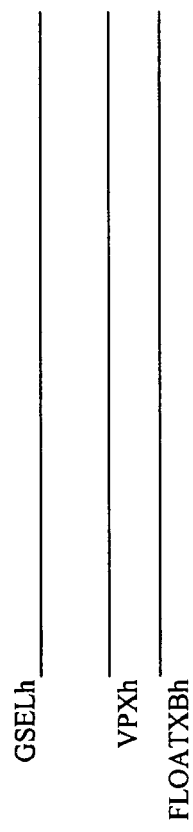
Fig. 5A Program
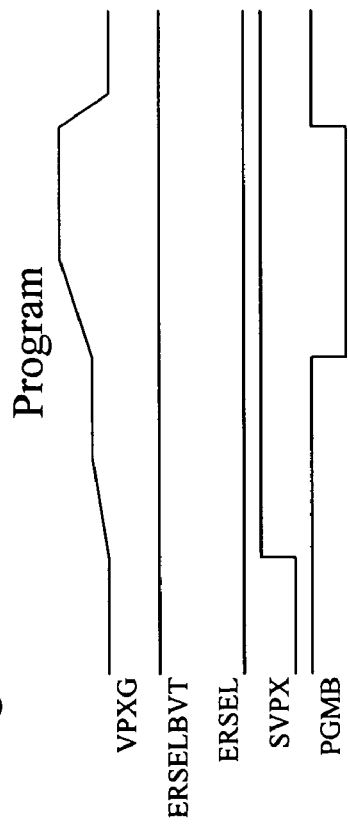
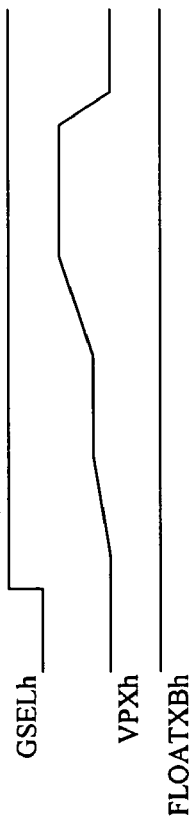
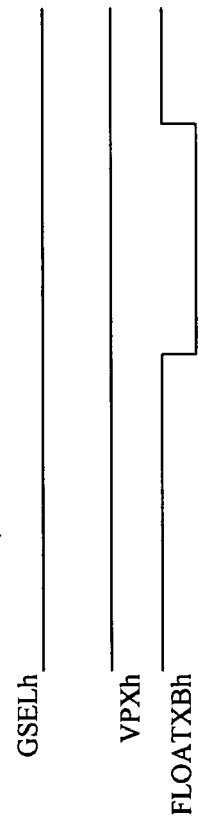
Fig. 5B Erase

Fig. 9A Program

Fig. 9B Erase

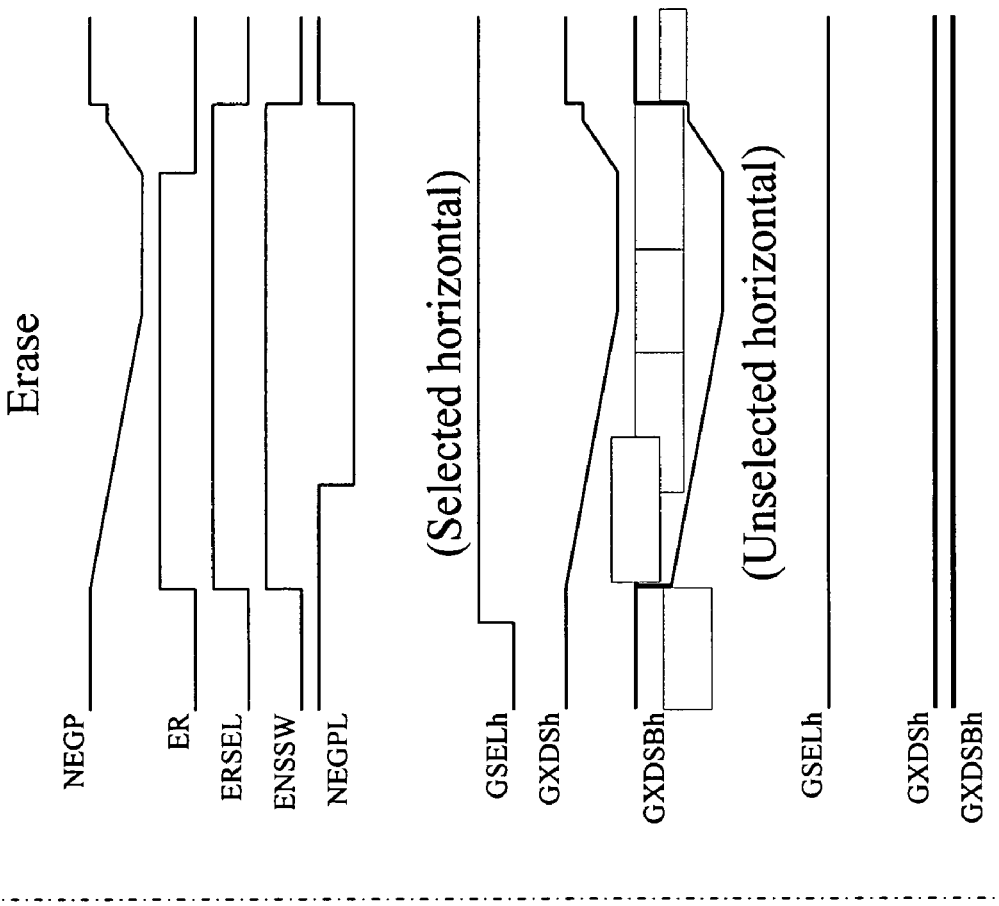
Fig. 11B  Erase
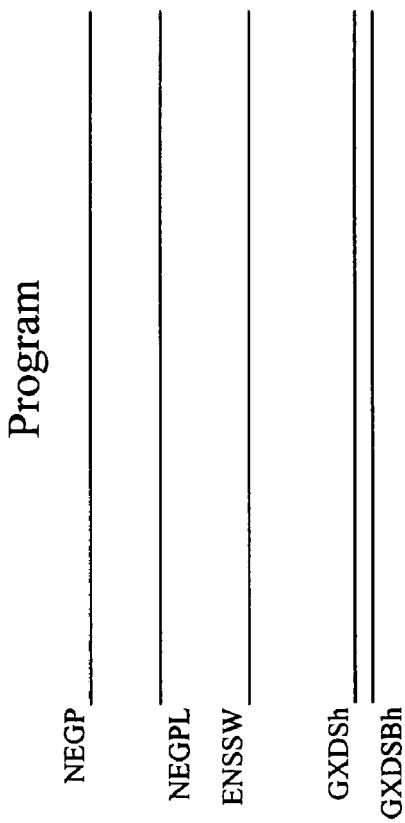
Fig. 11A  Program

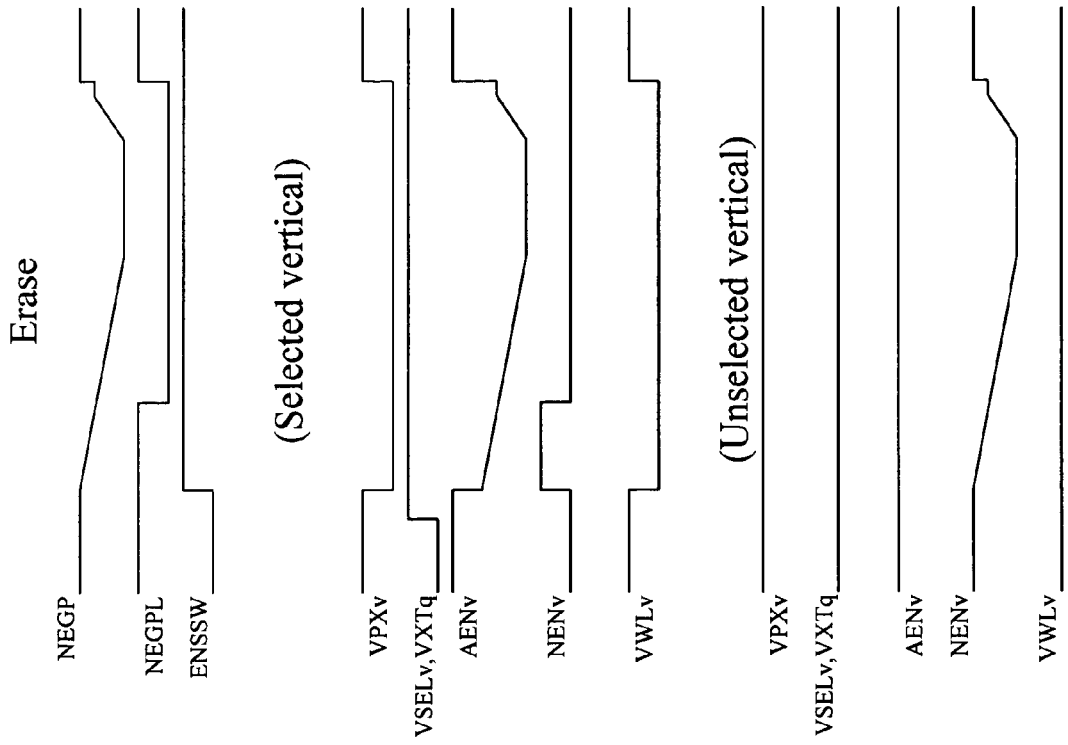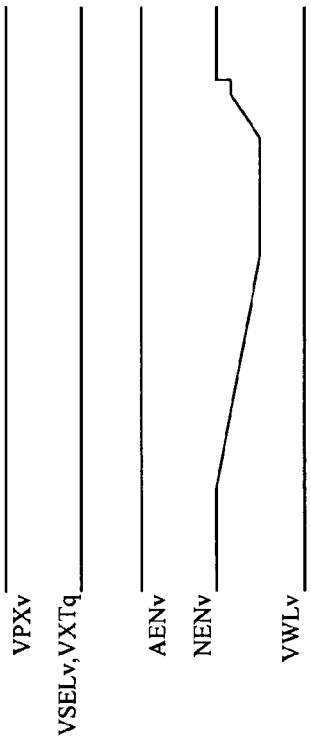
Fig. 14A Program
Fig. 14B Erase
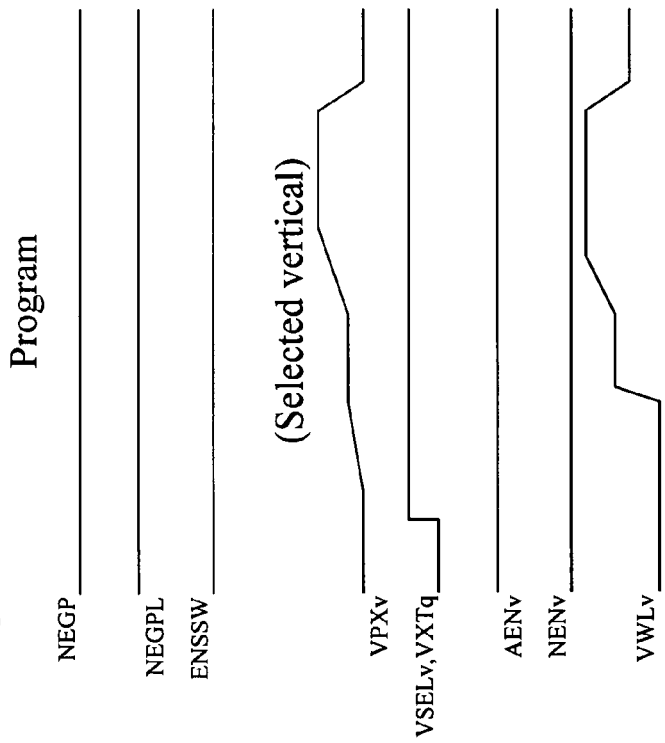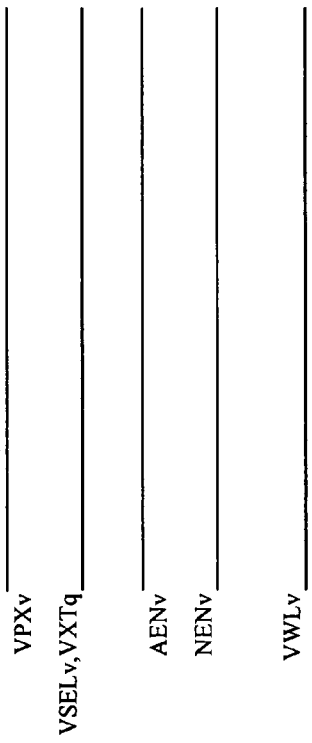

US 7,450,434 B2

SEMICONDUCTOR DEVICE AND ITS CONTROL METHOD

CROSS REFERENCE TO RELATED APPLICATIONS

This is a continuation of International Application No. PCT/JP2004/006375, filed May 12, 2004.

BACKGROUND OF THE INVENTION

1. Field of the Invention

The present invention relates to a semiconductor device, and more particularly, to a semiconductor device having global word lines connecting a plurality of sectors and local word lines provided in the sectors and a method of controlling the same.

2. Description of the Related Art

Recently, applications of the non-volatile semiconductor memories such as flash memories have drastically expanded. It is known that the flash memory has a cell array of a NOR type, NAND type or AND type. One of the features of the flash memory is to perform erasing on the sector basis. There have been many proposals of the arrangement of sectors. For instance, it is known that the sectors are arrayed in a matrix formation in which the sectors are laterally connected by global word lines, and are vertically connected by vertical word lines. Each of the sectors has a respective local word line with which a connection is selectively made by the global word line and the vertical word line.

The above-mentioned structure has a problem about the reduction of current consumed. The above-mentioned array requires complicated switching, and is likely to waste current such as leakage current. As the capacity of the flash memory increases, the problem becomes more conspicuous.

SUMMARY OF THE INVENTION

The present invention has an objective of reducing current consumed in semiconductor devices such as a non-volatile semiconductor memory.

The present invention is a semiconductor device comprising: sectors having memory cells connected to local word lines; decoders selecting the sectors; and a circuit generating, in erasing of a selected sector, a control signal that causes a corresponding one of the decoders associated with the selected sector to be temporarily unselected.

The above semiconductor device may be configured so that: each of the sectors comprises a pull-up transistor that is driven by a corresponding one of the decoders via a corresponding one of global word lines connecting the sectors and drives one of the local word lines; and the pull-up transistor is kept OFF by the control signal.

The semiconductor device may be configured so that the circuit generates the control signal that keeps the corresponding one of the decoders unselected in an initial stage of erasing.

The semiconductor device may be configured so that the circuit generates the control signal that keeps the corresponding one of the decoders unselected until a negative pump path connected to the corresponding one of the decoders unselected falls to a given intermediate negative voltage in erasing.

The semiconductor device may be configured so that: each of the sectors comprises a pull-up transistor and a pull-down transistor for driving one of the local word lines, both transistors being driven by a corresponding one of the decoders; and the control signal disabling a path including the pull-up and pull-down transistors for a given period of time in erasing.

The present invention includes a semiconductor device comprising: sectors having memory cells connected to local word lines; decoders selecting the sectors; and a circuit generating, in programming of a selected sector, control signals that cause the local word lines of unselected sectors to be in a floating state.

The semiconductor device may be configured so that: each of the sectors comprises a pull-up transistor and a pull-down transistor for driving one of the local word lines, both transistors being driven by a corresponding one of the decoders; and the control signals turning OFF the pull-up and pull-down transistors in the unselected sectors in programming.

The semiconductor device may be configured so that one of the decoders associated with the selected sector to be programmed sets unselected local word lines in the selected sector at a given potential via a global word line that connects said one of the decoders and the selected sector.

The present invention includes a semiconductor device comprising: sectors having memory cells connected to local word lines; decoders selecting the sectors via global word lines; a dummy line; and a circuit coupling the dummy line with the global word lines at the time of discharging the local word lines after erasing using a negative voltage applied to the local word lines.

The semiconductor device may be configured so as to further comprise a bias circuit biasing a given voltage to the dummy line in reading and programming.

The semiconductor device may be configured so as to further comprise another circuit generating, in erasing of a selected sector, a control signal that causes a corresponding one of the decoders associated with the selected sector to be temporarily unselected.

The semiconductor device may be configured so as to further comprise yet another circuit generating, in programming of a selected sector, control signals that cause the local word lines of unselected sectors to be in a floating state.

The semiconductor device may be configured so that the memory cells are non-volatile memory cells.

The present invention includes a method of controlling a semiconductor device comprising the steps of: selecting one of sectors having memory cells connected to local word lines; and generating, in erasing of a selected sector, a control signal that causes a decoder for selectively driving the selected sector to be temporarily unselected.

The present invention includes a method of controlling a semiconductor device comprising the steps of: selecting one of sectors having memory cells connected to local word lines; and generating, in programming of a selected sector, control signals that that cause the local word lines of unselected sectors to be in a floating state.

The present invention includes a method of controlling a semiconductor device comprising the steps of: selecting one of sectors having memory cells connected to local word lines; and coupling a dummy line with a global word line at the time of discharging the local word lines after erasing using a negative voltage applied to the local word lines.

BRIEF DESCRIPTION OF THE DRAWINGS

Preferred embodiments of the present invention will be described in detail based on the following figures, wherein:

FIG. 2A shows the levels of signals applied to a global word line decoder of the semiconductor device shown in FIG. 1;

FIG. 2B shows the levels of signals applied to a vertical word line decoder of the semiconductor device shown in FIG. 1;

FIG. 2C shows the levels of signals applied to a sector switch control circuit of the semiconductor device shown in FIG. 1;

FIG. 2D shows the levels of signals applied to a local word line decoder of the semiconductor device shown in FIG. 1;

FIGS. 5A and 5B are timing charts of the operation of the high-voltage output circuit shown in FIG. 4;

FIGS. 11A and 11B are timing charts of the operations of the predetermined voltage detection circuit shown in FIG. 8 and the global sector switch circuit;

FIGS. 14A and 14B are timing charts of the operations of the global sector switch circuit shown in FIG. 12 and the vertical word line decoder shown in FIG. 13;

DESCRIPTION OF THE PREFERRED EMBODIMENTS

A description will now be given, with reference to the accompanying drawings, of embodiments of the present invention.

First Embodiment

Figure 1:
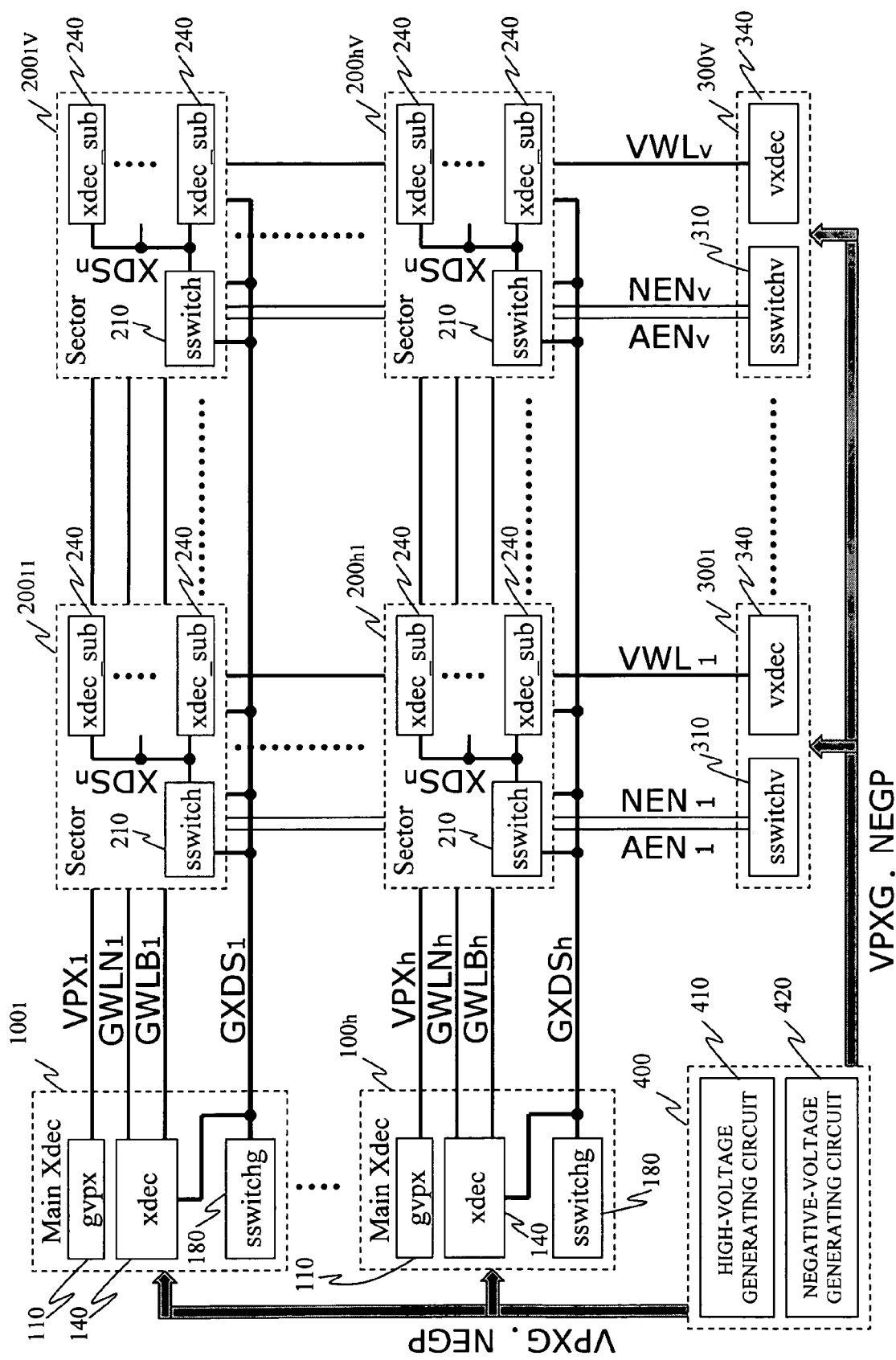
FIG. 1 is a diagram of the entire structure of a semiconductor device according to a first embodiment of the present invention.

FIG. 1 is a block diagram of a structure of a flash memory which is an example of a non-volatile semiconductor memory according to a first embodiment of the present invention. The flash memory has a plurality of sectors $200_{11}$-$200_{hv}$ arranged in rows and columns (h and v are respectively arbitrary natural numbers). Each of the sectors $200_{11}$-$200_{hv}$ has non-volatile memory cells. Each of the rows has the same structure, and each of the columns has the same structure. Thus, the following description is mainly directed to only the hth row and the vth column, and a description of the other rows and columns may be omitted occasionally.

A pair of global word lines GWLNh and GWLBh connects the sectors $200_{h1}$-$200_{hv}$ in the hth row in the lateral direction (row direction). A program/read voltage supply line VPXh and a sector switch control line GXDSh are provided laterally and are connected to the sectors $200_{h1}$-$100_{hv}$. Main decoders (row decoders) $100_1$-$200_h$ are provided in the rows. The main decoder $100_h$ controls the pair of global word lines GWLNh and GWLBh, the program/read voltage supply line VPXh, and the sector switch control line GXDSh. The main decoder $100_h$ has a high-voltage output circuit (gvpx) 110, a global word line decoder (xdec) 140, and a global sector switch circuit (sswitchg) 180. The high-voltage output circuit 110 supplies the sectors $200_{h1}$-$200_{hv}$ with a program/read voltage VPXh. The global word line decoder 140 selectively drives the global word line GWLNh and GWLBh. The global sector switch circuit 180 controls the sector switch control line GXDSh in the row direction. The main decoders $100_1$-$100_n$ are supplied with a high voltage VPXG and a negative voltage NEGP from a voltage generating circuit 400. The voltage generating circuit 400 has a high-voltage generating circuit 410 that generates the high voltage VPXG, and a negative voltage generating circuit 420 that generates the negative voltage NEGP. The negative voltage NEGP is used to erase the sectors, as will be described later.

Column decoders $300_1$-$300_v$ are provided in the columns. Sector switch select signal lines AENv and NENv and a vertical word line VWLv that extend from the column decoder $300_v$ are connected to the sectors $100_{1v}$-$100_{hv}$ located in the vth column. The column decoder $300v$ has a global sector switch circuit (sswitchv) 310 in the column direction, and a vertical word line decoder (vxdec) 340. The global sector switch circuit 310 selects the sector switch select signal lines AENv and NENv. The vertical word line decoder 340 selectively drives the vertical word line VWLv. The voltage generating circuit 400 supplies the column decoders $300_1$-$300_v$ with the high voltage VPXG and the negative voltage NEGP.

The sector $200_{hv}$ has a sector switch circuit (sswitch) 210 and local word line decoders (xdec_sub) 240 each of which is associated with a respective one of the local word lines provided therein. The sector switch circuit 210 is controlled by the sector switch select signal lines AENv and NENv, and supplies a signal line XDSn with the negative voltage NEGP or ground voltage Vss. The local word line decoders 240 are selectively connected to the vertical word line VWLv. The selected local word line decoder 240 supplies the associated local word line with the high voltage VPXh or ground voltage Vss supplied via the vertical word line VWLv. Memory cells are connected to the local word line.

An outline of the operation of the flash memory will now be described. One sector and one local word line provided therein are selected by the signals VPXh, GWLNh, GWLBh and GXDSh in the row direction and the signals VWLv, AENv and NENv in the column direction. The negative voltage NEGP output by the global sector switch circuit 180 in the main decoder 100$_h$ is supplied to the selected local word line in the selected sector via the line GXDSh. The line GXDSh is common to the sectors 200$_{h1}$-200$_{hv}$ in the row direction, and are sequentially connected thereto starting from the sector 200h1 closest to the main decoder 100$_h$.

FIGS. 2A through 2D show an outline of the operation of the flash memory shown in FIG. 1. FIG. 2A is a view of an operation of the global word line decoder (xdec) 140, FIG. 2B is a view of an operation of the vertical word line decoder (vxdec) 340, FIG. 2C is a view of an operation of the sector switch circuit (sswitch) 210, and FIG. 2D is a view of an operation of the local word line decoder (xdec_sub) 240. FIGS. 2A through 2D show operations in erase verification, erasing and programming. The operations in reading are the same as those in programming.

For convenience of explanation, the local word line decoder (xdec_sub) 240 will be described first. As will be described below, there is a possibility that a leakage current may flow through the local word line decoder 240 in the shift from the erase verification to the erasing and in the programming unless the following circuit configuration is employed. In the following, the configuration of the local word line decoder 240 will be described with reference to FIG. 3 first, the leakage current that may flow in the shift from the erase verification to the erasing and in the programming will be described second, and an outline of the configuration designed to prevent the occurrence of the leakage current will be described third.

Figure 3:
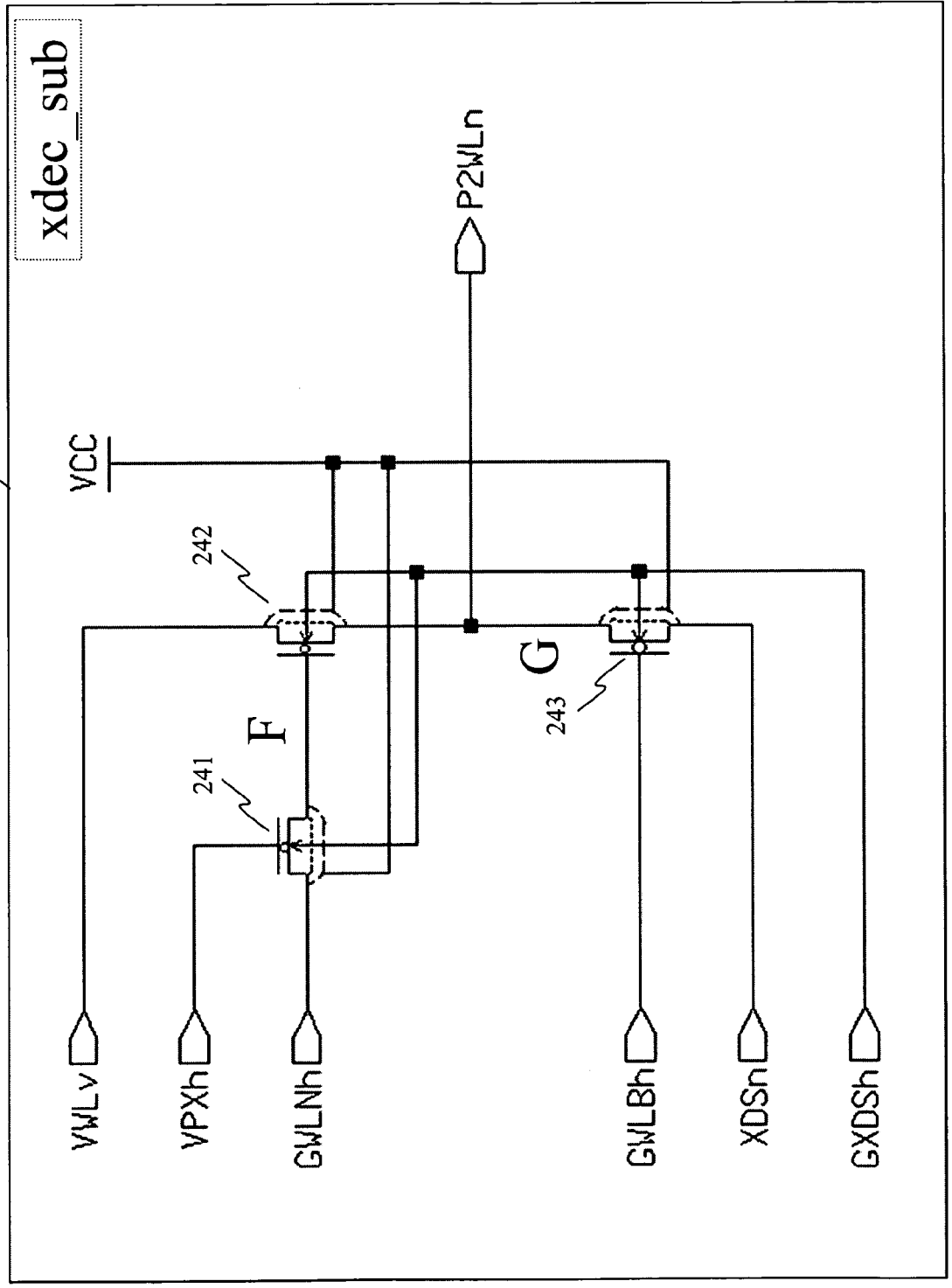
FIG. 3 is a circuit diagram of the local word line decoder (xdec_sub) provided in the semiconductor device shown in FIG. 1.

FIG. 3 is a circuit diagram of a configuration of the local word line decoder (xdec_sub) 240. The local word line decoder 240 is made up of N-channel transistors 241, 242 and 243. The transistor 242 is a pull-up transistor, and the transistor 243 is a pull-down transistor. The vertical word line VWLv is selectively connected to the local word line P2WLn via the transistor 242, and the sector switch control line XDSn from the sector switch circuit 210 is selectively connected to the local word line P2WLn via the transistor 243. The transistors 241, 242 and 243 are formed in P-type wells, and are back-biased by the sector switch control line GXDSh extending from the global sector switch circuit 180 of the main decoder 100$h$. The P-type wells that respectively include the transistors 241, 242 and 243 are provided in an N-type well for isolation from a P-type substrate. The N-type well is biased by a power supply voltage Vcc. The gate of the transistor 242 is controlled by the global word line GWLNh via the transistor 241. The gate of the transistor 241 is connected to the high-voltage supply line VPXh that extends from the high voltage output circuit 110 of the main decoder 100$h$. The gate of the transistor 243 is controlled by the global word line GWLBh. A small circle given to the symbol of each transistor denotes that these transistors have threshold voltages lower than these of transistors described by symbols having no circle.

The voltages shown in FIG. 2D are applied to the selected word line and unselected word lines at the time of erase verification. The detail is as follows. At the time of erase verification, GWLNh/GWLBh=VPXh/Vss, VWLv=VPXV and the local word line P2WLn is supplied with the high voltage in connection with the selected word line. In connection with the unselected word lines, the local word line P2WLn is Vss under the condition that GWLNh/GWLBh=VPXh/Vss (selected) and VWLv=Vss (unselected), or GWLNh/GWLBh=Vss/Vcc (unselected) and VWLv=VPXV (selected). At the time of erasing, in connection with the selected sector, GWLNh/GWLBh=NEGP/Vcc, VWLv=Vss, XDSn=GXDSh=NEGP, and the locak word line P2WLn is supplied with the negative voltage. In connection with the unselected sectors, the local word line P2WLn is Vss under the condition that GWLNh/GWLBh=NEGP/Vss (selected) and XDSn=Vss (unselected), or GWLNh/GWLBh=Vss/Vcc (unselected) and XDSn=Vss (unselected). In this case, the former condition, the local word line P2SLn is in the floating state, the word line P2WLn has a negative voltage due to coupling resulting from GWLNhg=NEGP. However, there is no substantial adverse influence.

In the sector selected through the global word line GWLNh and GWLBh when the operation shifts from the erase verification to the erase operation, it is desired to shift the local word line P2WLn from the high voltage to the negative voltage quickly. In order to achieve the quick shifting, it is required to turn OFF the transistor 242 from ON quickly and turn ON the transistor 243 from OFF quickly. Just prior to the shift to the erase operation, the global word line GWLNh is at the high voltage VPXh, which turns ON the transistor 242. Thus, the voltage sufficient to set the global word line P2WLn to the high voltage by turning ON the transistor 242 is retained at a node F. In this state, when the operation shifts from the erase verification to the erase operation, the global word line GWLNh connected to the selected sector changes from the high voltage VPXh to the negative voltage NEGP. At this time, in the conventional art, the global word line GWLNh is maintained at a voltage higher than Vss. Thus, the transistor 242 is maintained in the ON state, and a leakage current path from the vertical word line VWLv is formed. Thus, the local word line P2WLn cannot be efficiently driven to the negative voltage NEGP via the transistor 243. In contrast, the present embodiment employs the unique structure that will be described later. This structure forcedly turns OFF the transistor 242 during a given period of time from the start of the erase operation, and thus drives the local word line P2WLn to the negative voltage NEGP quickly. The above-mentioned leakage current path occurs in the local word line decoders 240 in the selected sector. Therefore, as the memory capacity increases, the efficiency of the supply of the negative voltage NEGP decreases, and there may be a case where the negative voltage NEGP cannot be supplied. The suppression of the leakage current path according to the present embodiment is especially advantageous to the above-mentioned situation.

There is also a possibility that the leakage current may flow through the local word line decoders 240 shown in FIG. 3 at the time of programming. During the programming, on the selected vertical word line VWLv (=VPXV), there are provided the local word line decoder 240 in which the global word lines GWLNh/GWLBh are in the selected states (=VPXh/VPXV) and the other local word line decoders 240 in which the glocal word lines GWLNh/GWLBh are in the unselected states (=Vss/Vcc). In the local word line decoders 240 in which the global word lines GWLNh/GWLBh are in the unselected states, the transistors 242 are OFF because of GWLNh=Vss, and the transistor 243 is ON. However, since the transistors 242 and 243 have small threshold values, there is a slight leakage current flowing in the transistor 242. As the memory capacity increases, an increased number of unselected local word line decoders 240 exists, and the adverse influence of the leakage current becomes more conspicuous. In order to solve this problem, the present embodiment employs a unique structure that turns OFF both the transistors 242 and 243 in each of the local word line decoders 240 in the unselected states at the time of programming so that no leakage current can flow through the transistors 242 and 243 (as shown in FIG. 2D, the transistor 243 is turned OFF by setting the global word line GWLBh to Vss). Thus, the word line lines P2WLn in the unselected sectors are in the floating states, and the local word line P2WLn driven by the local word line decoder 240 on the selected vertical word line VWLv does not affect the programming although the level of the local word line P2WLn is slightly raised due to coupling. It is to be noted that the bit line level is raised in the selected sector. In order to prevent erroneous programming due to the coupling-based rise of the local word line P2WLn, it is required to connect the unselected local word lines to the ground potential Vss. This causes a leakage current to flow in the unselected local word line decoders 240 in the selected sector. However, there is no adverse influence unless a huge number of unselected local word line decoders is employed.

A description will be given of parts of the structure shown in FIG. 1.

Figure 4:
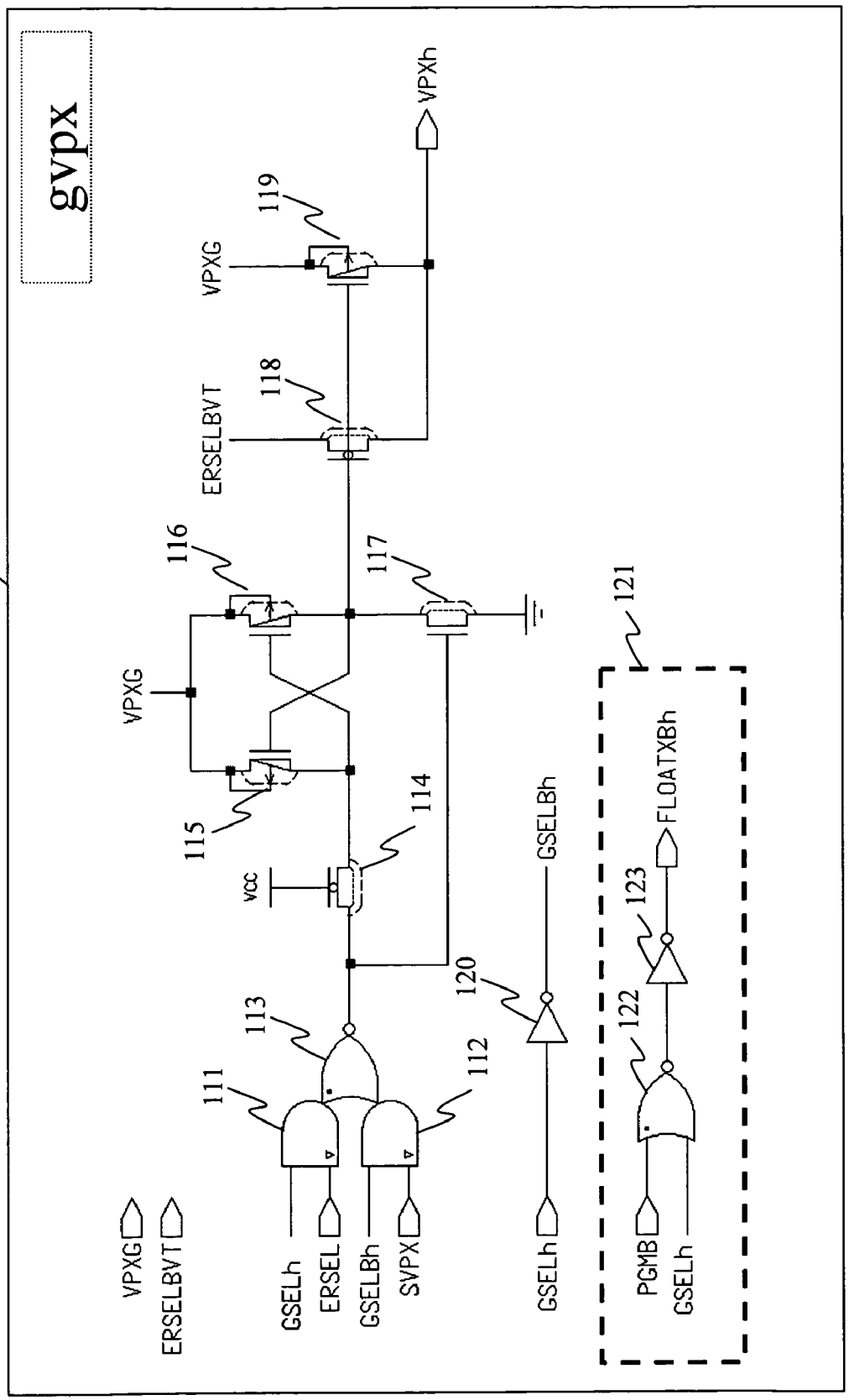
FIG. 4 is a circuit diagram of a high-voltage output circuit (gvpx) provided in the semiconductor device shown in FIG. 1.

FIG. 4 is a circuit diagram of the high-voltage output circuit (gvpx) 110 provided in the main decoder 100h. The high-voltage output circuit 110 outputs the high voltage VPXh, and has AND gates 111, 112, a NOR gate 113, N-channel transistors 114, 117 and 118, P-channel transistors 115, 116 and 119, an inverter 120 and a floating instruction signal generating circuit 121. A symbol GSELh is a global word line select instruction signal, a symbol ERSEL is an erase decode period instruction signal, a symbol GSELBh is an inverted signal of the global word line select instruction signal GSELh, a symbol SVPX is a VPX select instruction signal, a symbol VPXG is the high voltage (>Vcc) generated by a charge pump operation, a symbol ERSELBVT is an inverted signal of the erase period instruction signal ERSEL, a symbol PGMB is a signal that indicates a period of time during which the high voltage is applied to the gate and drain of the memory cell during the period of programming, a symbol FLOATXBh is a signal indicating a floating period. The control signals GSELh, ERSEL, GSELh, SVPX, ERSELBVT and PGMB are supplied from a control circuit (control circuit 520 shown in FIG. 20) that will be described later.

FIGS. 5A and 5B show an operation of the high-voltage output circuit 110. FIG. 5A shows the operation at the time of programming, and FIG. 5B shows the operation at the time of erasing. When the global word line in the hth row is selected at the time of programming, the high-voltage output circuit 110 in the main decoder 100h generates the high voltage VPXh (>Vcc) from the voltage VPXG that is raised by the charge pump operation, and outputs the high voltage VPXh. If the global word line in the hth row is unselected at the time of programming, the high-voltage output circuit 110 remains the output voltage VPXh at Vcc. When the global word line in the hth row is selected at the time of erasing, the high-voltage output circuit 110 in the main decoder 100h generates the output voltage VPXh equal to Vss. When the above global word line is unselected, the high-voltage output circuit 110 retains the output voltage VPXh at Vcc. The floating instruction signal generating circuit 121 outputs a low-level signal in synchronism with the control signal PGMB when the global word line in the hth row is unselected at the time of programming.

Figure 6:
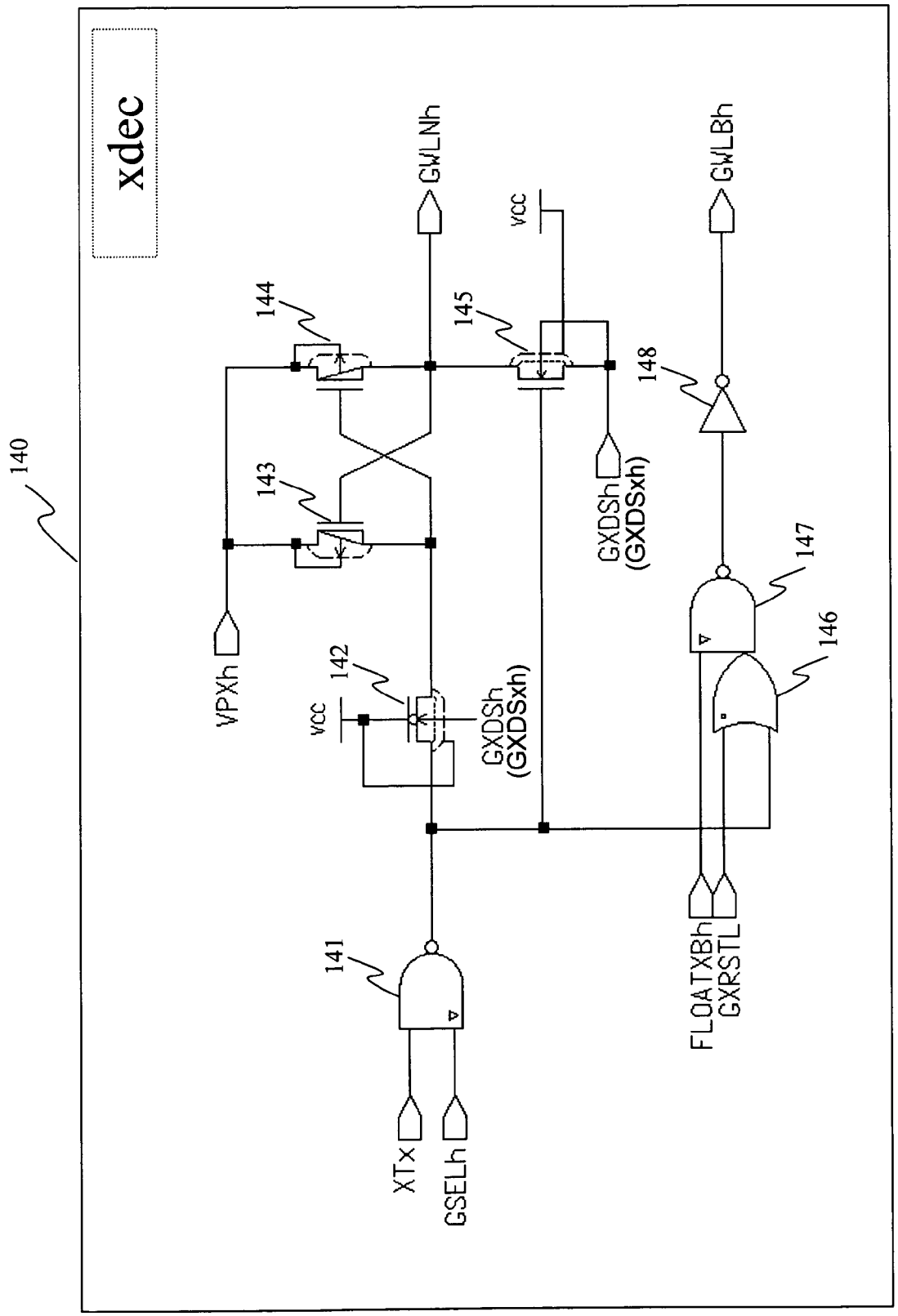
FIG. 6 is a circuit diagram of a global word line (row direction) decoder (xdec) provided in the semiconductor device shown in FIG. 1.

FIG. 6 is a circuit diagram of the global word line decoder (xdec) 140 provided in the main decoder 100h. The global word line decoder 140 includes NAND gates 141, 147, N-channel transistors 142, 145, P-channel transistors 143 and 144, an OR gate 146 and an inverter 148. The voltage VPXh from the high-voltage output circuit 110 shown in FIG. 4 is applied to the sources of the transistors 143 and 144, and the control signal FLOATXBh is applied to the NAND gate 147. A signal GXRSTL is supplied from a control circuit that will be described later, and is used to reset the global word lines GWLNh and GWLBh or set these lines to Vss. A signal XTx is supplied from an XT generating circuit 150, which will be described with reference to FIG. 7, and is used to select the global word line decoder 140 of the main decoder 100y. The operation of the global word line decoder 140 will be described later with reference to FIGS. 9A and 9B.

Figure 7:
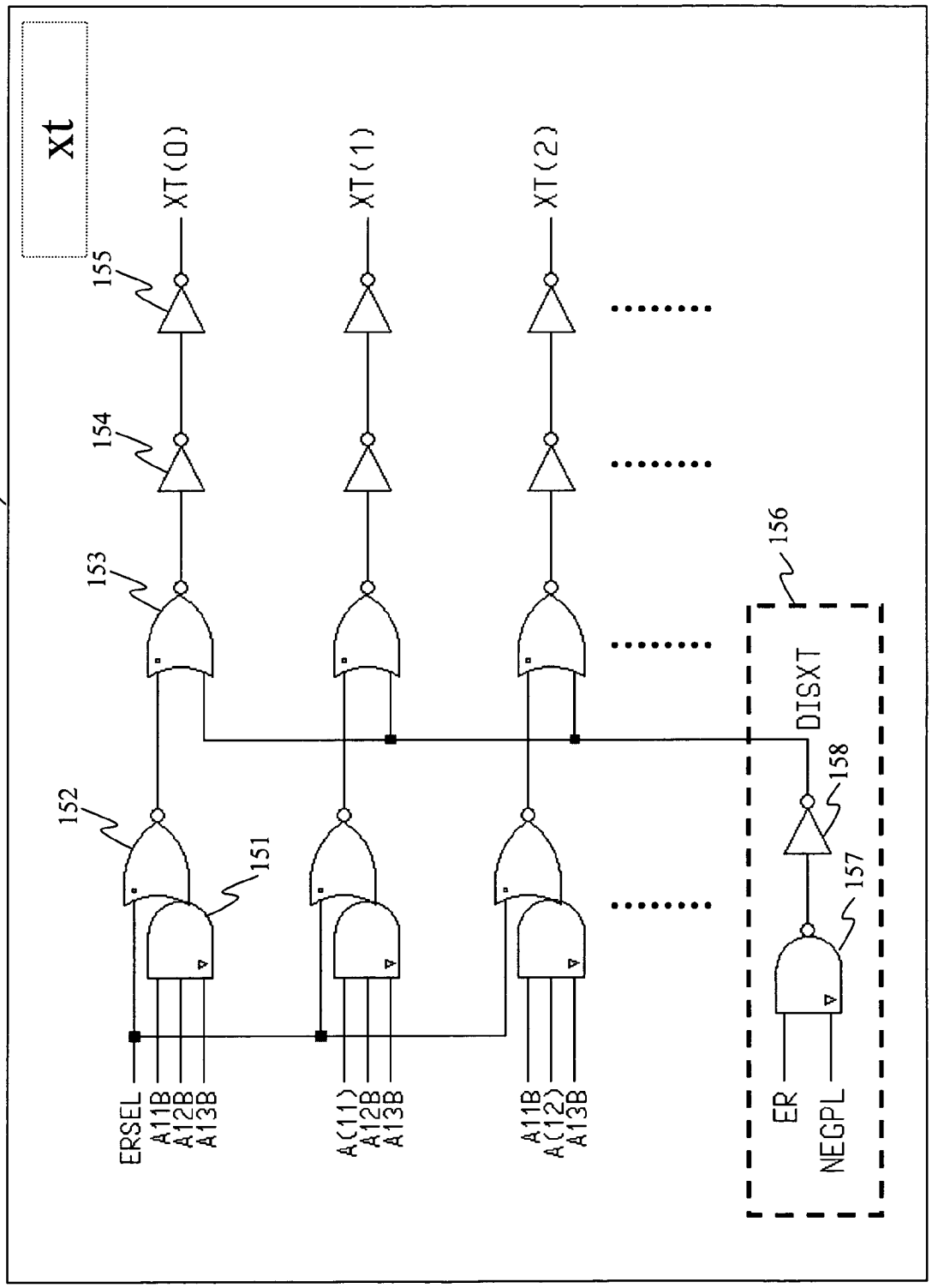
FIG. 7 is a circuit diagram of an XT generating circuit used in the semiconductor device shown in FIG. 1.

FIG. 7 is a circuit diagram of the XT generating circuit 150. The XT generating circuit 150 outputs signals XT(0)-XT(h) to the main decoders $100_1$-$100_h$, respectively. The XT generating circuit 150 decodes an address signal to select one main decoder. The XT generating circuit 150 includes x decode circuits each having an identical structure. It is now assumed that x xdec circuits are provided in the main decoder. For example, the decode circuit that outputs the signal XT(0) includes an AND gate 151, NOR gates 152 and 153, and inverters 154 and 155. The AND gate 151 is supplied with three bits A11B, A12B and A13B among the bits consisting of the address signal. The output of the AND gate 151 is supplied to the NOR gate 152, which performs a NOR operation on the output of the AND gate 151 and the signal ERSEL that is at the high level at the time of erasing. The output of the NOR gate 152 is supplied to the NOR gate 153, which performs a NOR operation on the output of the NOR gate 152 and a disable signal DISXT output by a disable signal generating circuit 156. The output of the NOR gate 153 passes through the inverters 154 and 155, and is output as XT(0). The disable signal generating circuit 156 generates, by means of a NAND gate 157 and an inverter 158, the disable signal DISXT from an erase instruction signal ER output by the after-mentioned control circuit and a detection signal NEGPL generated by a predetermined potential detection circuit 160 that will be described later with reference to FIG. 8. The signals XT(0) . . . generated by the XT generating circuit 150 function as control signals that temporarily causes the decoder connected to the selected sector to be unselected. The operation of the XT generating circuit 150 will be described later with reference to FIGS. 9A and 9B.

Figure 8:
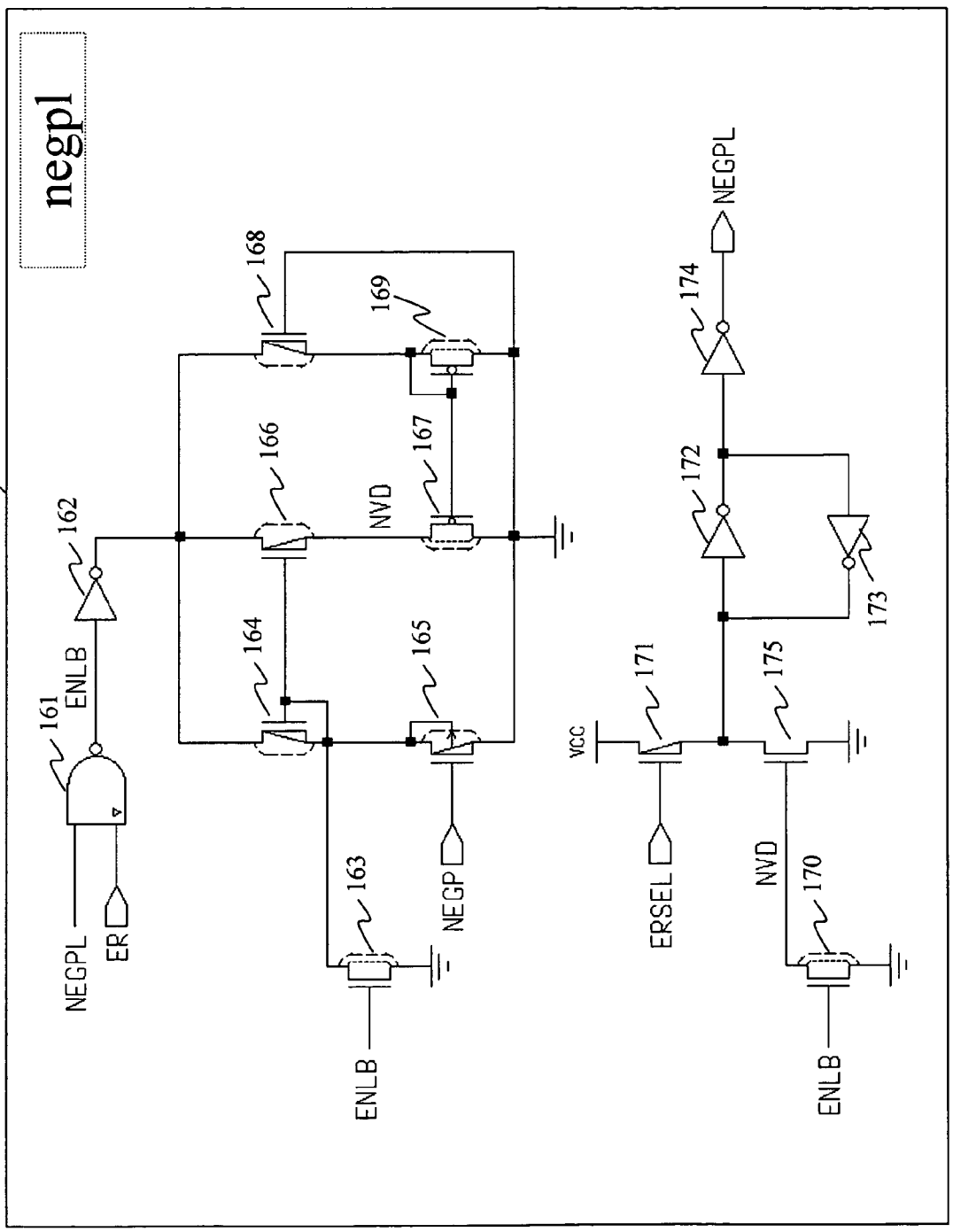
FIG. 8 is a circuit diagram of a predetermined potential detection circuit (negpl) used in the semiconductor device shown in FIG. 1.

FIG. 8 is a circuit diagram of the predetermined potential detection circuit 160, which detects a given negative voltage (for example, −3 V) in the process of a transition in which the negative voltage NEGP changes from Vss to a negative voltage (for example, −6 V) necessary for the erasing at the time of erasing. The given voltage detection circuit 160 includes a NAND gate 161, inverters 162, 172-174, N-channel transistors 163, 167, 169, 170 and 175, and P-channel transistors 164, 165, 166, 168 and 171. The negative voltage NEGP generated by the negative voltage generating circuit 420 is applied to the gate of the P-channel transistor 165. The NAND gate 161 receives a signal that is at the high level during the erasing period, and opens its gate. An output ENLB of the NAND gate 161 is applied to the gates of the transistors 163 and 170. When the negative voltage NEGP does not reach the given negative voltage equal to −3V from Vss, the P-channel transistor 165 is OFF, and a predetermined potential detection signal NEGPL is at Vcc. Thus, the signal ENLB is at the low level, and the output of the inverter 162 is at the high level. At that time, the transistors 164 and 166 are OFF. When the negative voltage NEGP falls to the predetermined potential (−3 V), the transistor 165 is turned ON, and the transistors 164 and 166 are turned ON. Thus, the potential of a node NVD rises, and the transistor 175 is turned ON. This changes the given potential detection signal NEGPL from the high level to the low level. Since the latch circuits of the inverters 172 and 173 retain the high level, the predetermined potential detection signal NEGPL changes to the low level. Even when the signal ENLB changes to the high level, the predetermined potential detection signal NEGPL is maintained at the low level.

Figure 9:
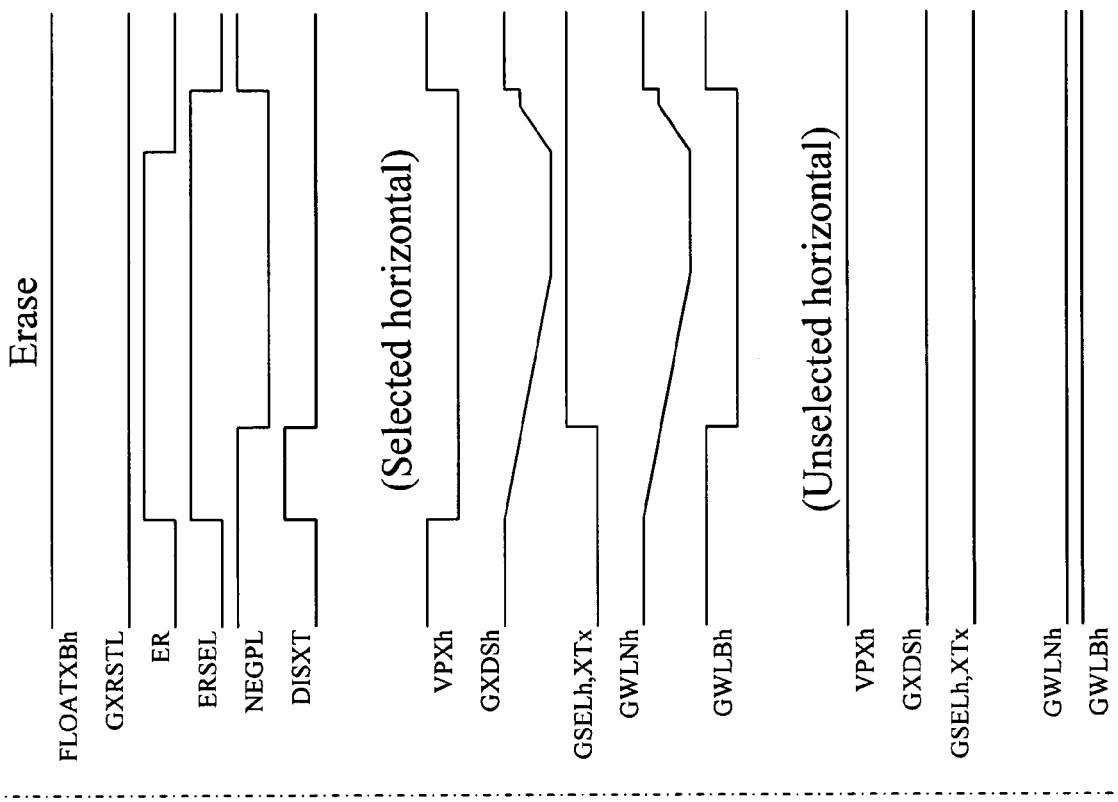
FIGS. 9A and 9B are timing charts of the operations of the global word line decoder shown in FIG. 6 and the XT generating circuit shown in FIG. 7.

FIGS. 9A and 9B are timing charts of the operations of the global word line decoder 140 (FIG. 6), the XT generating circuit 150 (FIG. 7), and the predetermined potential detection circuit 160 (FIG. 8). FIG. 9A shows the operations observed at the time of programming, and FIG. 9B shows the operations observed at the time of erasing. The aforementioned leakage current flowing through the local word line decoders 240 occurs in the following mechanism. First, a description is given of the leakage current that occurs when the operation changes from the erase verification operation to the erase operation. This leakage current results from a situation in which the operation enters into the erase operation and immediately a signal GSELh for selecting the main decoder 100h and the signal XTx for selecting the global word line decoder 140 are set to the high level (the signals GSELh and XTx are set to the high level even at the time of erase verification, and are retained at the high level at the time of the shift to the erase operation).

During the erase verification, the signals XTx and GSELh in the selected global word line decoder 140 shown in FIG. 6 are both at the high levels. Therefore, the transistor 144 is in the ON state (its gate voltage is equal to Vss), and the transistor 145 is in the OFF state (tis gate voltage is equal to Vss). Thus, the global word line GWLNh is supplied with the VPXh that is at the high voltage via the transistor 144. When the operation enters into the erase operation, the transistors 144 and 145 are both OFF because VPXh=Vss and GXDSh=Vss at the commencement of the erase operation in the state in which the global word line decoder 140 is continuously in the selected state, that is, the signal XTx is continuously retained at the high level. Thus, a voltage equal to Vss+Vta (Vta is the threshold value of the transistor 144) remains on the global word line GWLNh. In the local word line decoder 240 (FIG. 3) on the global word line GWLNh, the node F retains the voltage sufficient to pass the high voltage to the local word line P2WLn via the vertical word line VWLv during the erase verification. When the operation enters into the erase operation, GWLNh=Vss+Vta as described above, and a voltage equal to Vss+Vtb (Vtb is the threshold value of the transistor 241) remains at the node F. This voltage is sufficient to turn ON the transistor 242 (FIG. 3) in the process in which XDSn falls to the negative voltage after VWLv becomes equal to Vss, GWLBh becomes equal to Vcc and XDSn becomes equal to Vss in the erase operation. Thus, the transistor 242 serves as a leakage path, which does not prevent the efficient supply of the negative voltage to the local word line P2WLn. Also, at that time, the global word line GWLNh falls to the negative voltage following XDSn. However, since VPXh is already equal to Vss, the node F retains the voltage equal to Vss+Vtb until GWLNh falls to a voltage that turns ON the transistor 241. Therefore, there is the leakage current until GWLNh falls to the voltage that turns ON the transistor 241.

In contrast, according to the present embodiment, as shown in FIG. 9B, at the time of erasing, the selected global word line decoder 140 is not enabled in synchronism with the erase enable signal ER, but is enabled when it is detected that the negative voltage NEGP falls to the predetermined negative potential (−3 V) from Vss (NEGPL falls to the low level). That is, the signal XTx is retained at the low level until the negative voltage NEGP falls to the predetermined negative potential (−3 V) from Vss. In the shift from the erase verification operation to the erase operation, the signal XTx changes from the high level to the low level at the time of the above shift, and changes to the high level at the time when the negative voltage NEGP falls to the predetermined negative potential (−3 V) from Vss.

In the global word line decoder 140 shown in FIG. 6, the signal XTx is at the low level immediately after the erase operation is initiated. Thus, the global word line decoder 140 is in the unselected state, and the transistor 144 is OFF and the transistor 145 is ON. Thus, as the sector switch control line GXDSh is falling to the negative voltage from Vss, the global word line GWLNh is gradually falling from Vss. That is, the gate of the transistor 242 of the local word line decoder 240, that is the node F is supplied, via the transistor 142, with the voltage that gradually falls from Vss. Thus, the transistor 242 is controlled to OFF at the commencement of the erase operation. Thus, no leakage current path occurs. After that, the global word line decoder 140 is maintained in the unselected state until the negative voltage NEGP becomes equal to the predetermined negative voltage (−3 V). Then, negative voltage NEGP reaches the predetermined negative voltage (−3 V), and the predetermined potential detection signal NEGPL falls to the low level. Thus, XTs falls so that the word line decoder 140 returns to the selected state. If the word line decoder 140 is continuously in the unselected state, in the transistor 145 (FIG. 6), the potential difference between the gate voltage (=Vcc) and GXDSn becomes greater as GXDSn falls towards the negative voltage. This may cause a problem about the breakdown voltage of the transistor 145. Taking the above into consideration, the global word line decoder 140 is switched to the selected state when NEGP reaches −3 V and the gate voltage of the transistor 145 is set at the Vss level, the problem about the breakdown voltage can be avoided.

The operation of the unselected sectors at the time of erasing is as shown in the lower side of FIG. 9B.

As has been described previously, the local word line decoder 240 shown in FIG. 3 has the leakage current path that is formed at the time of programming. In order to cope with this problem, in the local word line decoders 240 in the unselected sectors, the local word lines P2WLn are set to the floating state. That is, the transistors 242 and 243 are both turned OFF. This is implemented by using the floating instruction signal FLOATXBh generated by the floating instruction signal generating circuit 121 shown in FIG. 5. The floating instruction signal FLOATXBh is applied to the NAND gate 147 of the global word line decoder 140 shown in FIG. 6. As shown in FIG. 9A, at the time of programming, in the unselected sectors, the floating instruction signal FLOATXBh changes from the high level to the low level, and the global word line GWLBh changes from the high level to the low level (Vss) responsive to the change of FLOATXBh. This change is the gate voltage of the transistor 243 shown in FIG. 3, and turns ON the transistor 243 from OFF. As shown in FIG. 9A, since the global word line GWLNh is retained at the low level (Vss), the transistor 242 is in the OFF state. In this manner, it is possible to prevent the leakage current path from being formed. In programming of the selected sector is, as shown in FIG. 9A, the global word line GWLNh is set to the high voltage by the charge pumping of VPXh. It is to be noted that the bit line level rises in the selected sector, and the local word line P2WLn may cause erroneous programming due to the coupling-based rise. In order to prevent this problem, it is required to set the unselected local word lines to the ground potential Vss. Although this allow leakage currents to flow in the unselected local word line decoders 240 in the selected sector, there is no adverse influence unless a huge number of unselected local word line decoders is employed.

Figure 10:
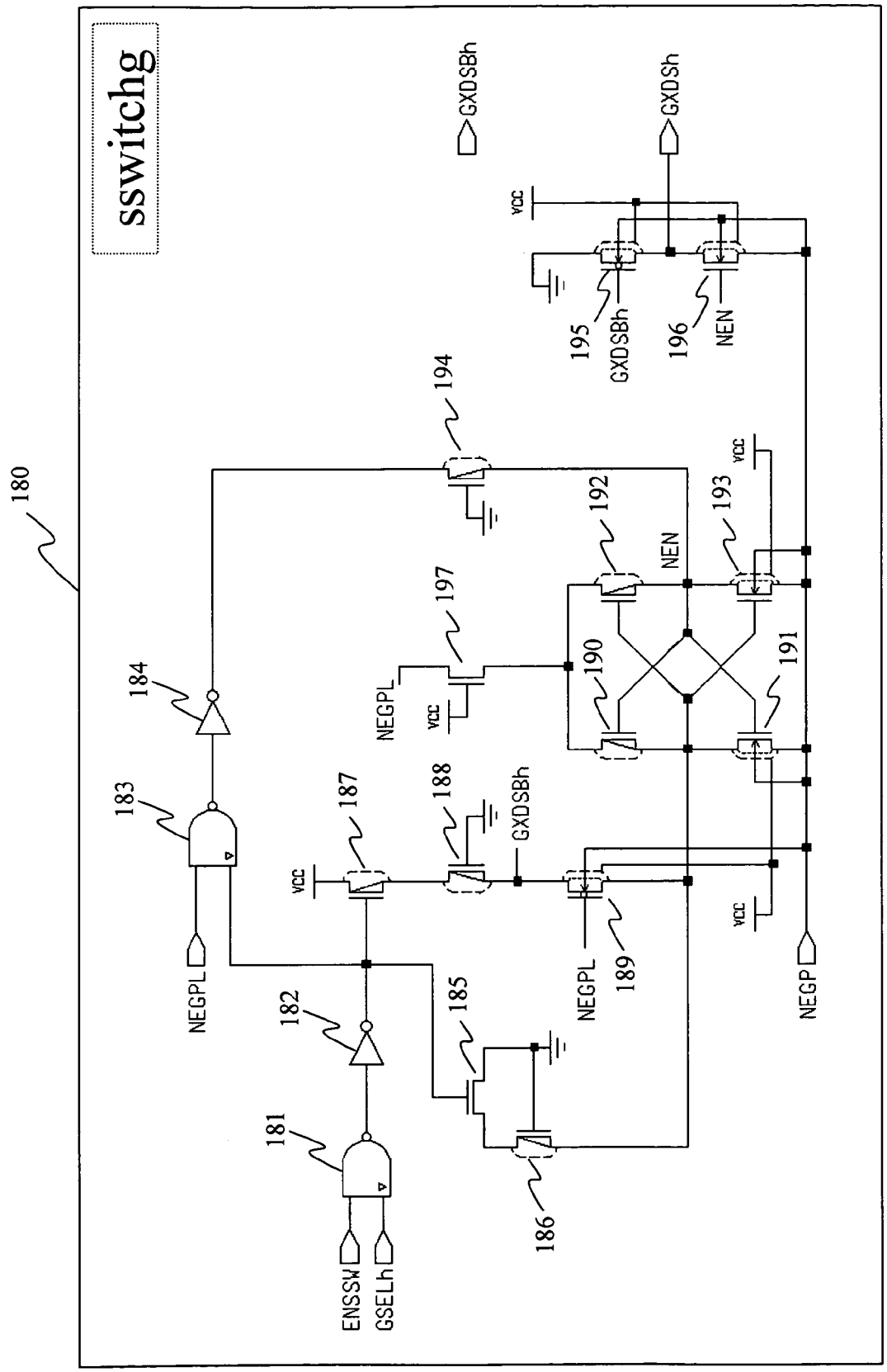
FIG. 10 is a circuit diagram of a global sector switch circuit (sswitchg) in the row direction provided in the semiconductor device shown in FIG. 1.

FIG. 10 a circuit diagram of the global sector switch circuit (sswitchg) 180 in the horizontal direction (row direction).

The global sector switch circuit 180 includes NAND gates 181 and 183, inverters 182 and 184, P-channel transistors 186, 187, 188, 190, 192 and 194, and N-channel transistors 185, 189, 191, 193, 195 and 196. A symbol ENSSW is a sector switch enable signal supplied from the after-mentioned control circuit, a symbol GSELh is a global word line select instruction signal, a symbol NEN is a sector switch decode signal supplied from the drain of the transistor 192. The global sector switch circuit 180 supplies the sector switch control line GXDSh with Vss via the transistor 195, and supplies it with the negative voltage NEGP via the transistor 196.

FIGS. 11A and 11B are timing charts of an operation of the global sector switch circuit 180 shown in FIG. 10. FIG. 11A shows an operation at the time of programming, and FIG. 11B shows an operation at the time of erasing. The control line GXDSh is set to the Vss level at the time of programming, and is set to the negative voltage NEGP generated by the negative voltage generating circuit 420 and output via the transistor 196. Along with the control line GXDSh, a sector switch control line GXDSBh is supplied to the sectors $200_{h1}$-$200_{hv}$. In FIG. 1, the illustration of the sector switch control line GXDSBh is omitted. The voltage NEGP is equal to Vss immediately after the global sector switch circuit 180 is selected. The aforementioned predetermined potential detection signal NEGPL is equal to Vss, and the transistors 191 and 189 are turned ON, and GXDSBh is equal to Vss. When the voltage NEGP falls from Vss and becomes equal to the predetermined potential (-3 V in the aforementioned example), the voltage NEGPL switches to Vss. At that time, the potential of NEGP (-3 V) is output to GXDXBh via the transistors 191 and 180. The node NEN is set at Vss (the potential of NEGPL) via the transistor 192, and GXDSh is output to the potential of NEGP (-3 V) via the transistor 196. In the unselected sectors, the control line GXDSBh is maintained at the high level.

Figure 12:
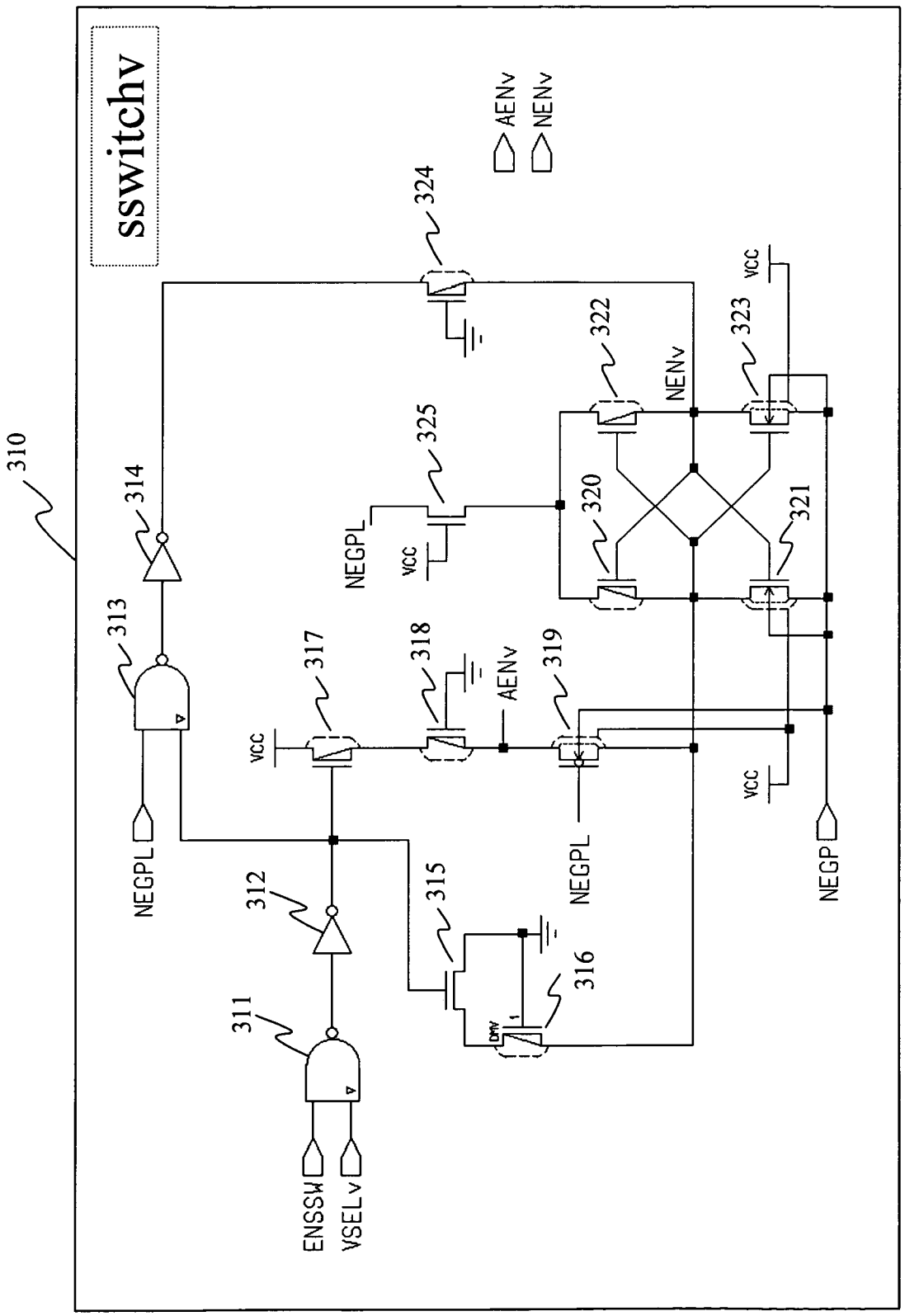
FIG. 12 is a circuit diagram of a global sector switch circuit (sswitchv) in the column direction provided in the semiconductor device shown in FIG. 1.

FIG. 12 a circuit diagram of the global sector switch circuit (sswitchv) 310 arranged in the vertical direction (column direction) and provided in the column decoder 300v. The circuit 310 has a configuration similar to that of the global sector switch circuit 180 arranged in the horizontal direction. More specifically, the global sector switch circuit 310 includes NAND gates 311, 313, inverters 312, 314, P-channel transistors 316, 317, 318, 320, 322 and 324, and N-channel transistors 315, 319, 321, 323, 325 and 196. The sector switch select signal AENv is output from the drain of the transistor 319, and the sector switch select signal NENv is output from the drain of the transistor 323. The operation of the global sector switch circuit 310 will be described later with reference to FIGS. 14A and 14B.

Figure 13:
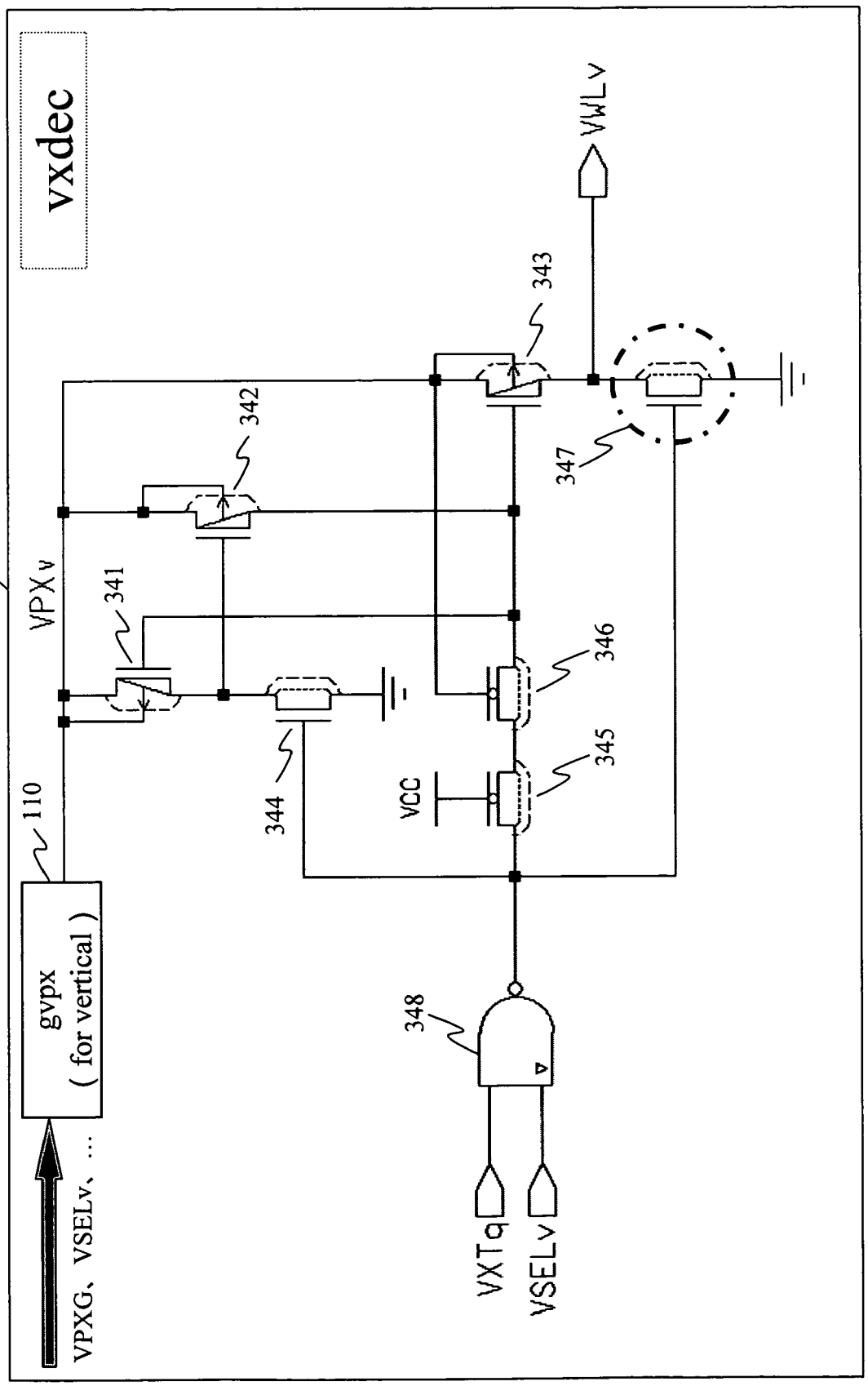
FIG. 13 is a circuit diagram of a vertical word line decoder (vdec) in the semiconductor device shown in FIG. 1.

FIG. 13 is a circuit diagram of the vertical word line decoder (vxdec) 340 provided in the column decoder 300v. The vertical word line decoder 340 has a NAND gate 348, P-channel transistors 341, 342 and 343, and N-channel transistors 344, 345 and 347. The NAND gate 348 is supplied with a vertical word line decoder driving signal VXTq and a select signal VSELv supplied from the after-mentioned control circuit. The high voltage VPXv generated by the high-voltage generating circuit 110 is applied to the transistors 341, 342 and 343, as shown in FIG. 12. When the transistor turns ON, the high voltage VPXv is applied to the vertical word line VWLv.

FIGS. 14 And 14B are timing charts of the global sector switch circuit (sswitchv) 310 and the vertical word line decoder (vxdec) 340. The setting of AENv=Vcc and NENv=NEGP=Vss is implemented in the global sector switches 310 in both the selected and unselected columns at the time of programming shown in FIG. 14. In the vertical word line decoder 340 in the selected column, the output of the NAND gate 348 shown in FIG. 13 switches to the low level, and the transistors 343 and 347 are turned ON and OFF, respectively. Thus, the vertical word line VWLv becomes equal to VPXV of the high voltage. In the unselected vertical word line decoders 340, the output of the NAND gate 348 is at the high level, and the vertical word line VWLv is equal to Vss. At the time of erasing shown in FIG. 14B, the global sector switch 310 in the selected column sets AENv to NEGP of the negative voltage, and changes NENv to the low level after setting it to the high level. At that time, in the global sector switch circuit 310 shown in FIG. 12, the transistor 315 is turned ON responsive to the change of the signal ENSSW to the high level, and the sector switch select signal line AENv is set to Vss via the transistors 316 and 319. Continuously, the sector switch select signal line AENv is set to the voltage of NEGP via the transistors 321 and 319. At the time of erasing, in the global sector switches 310 in the unselected columns, the sector switch select signal line AENv is set to the high level (Vcc), and the sector switch select signal line NENv is set to the voltage of NEGP via the transistor 323.

Figure 15:
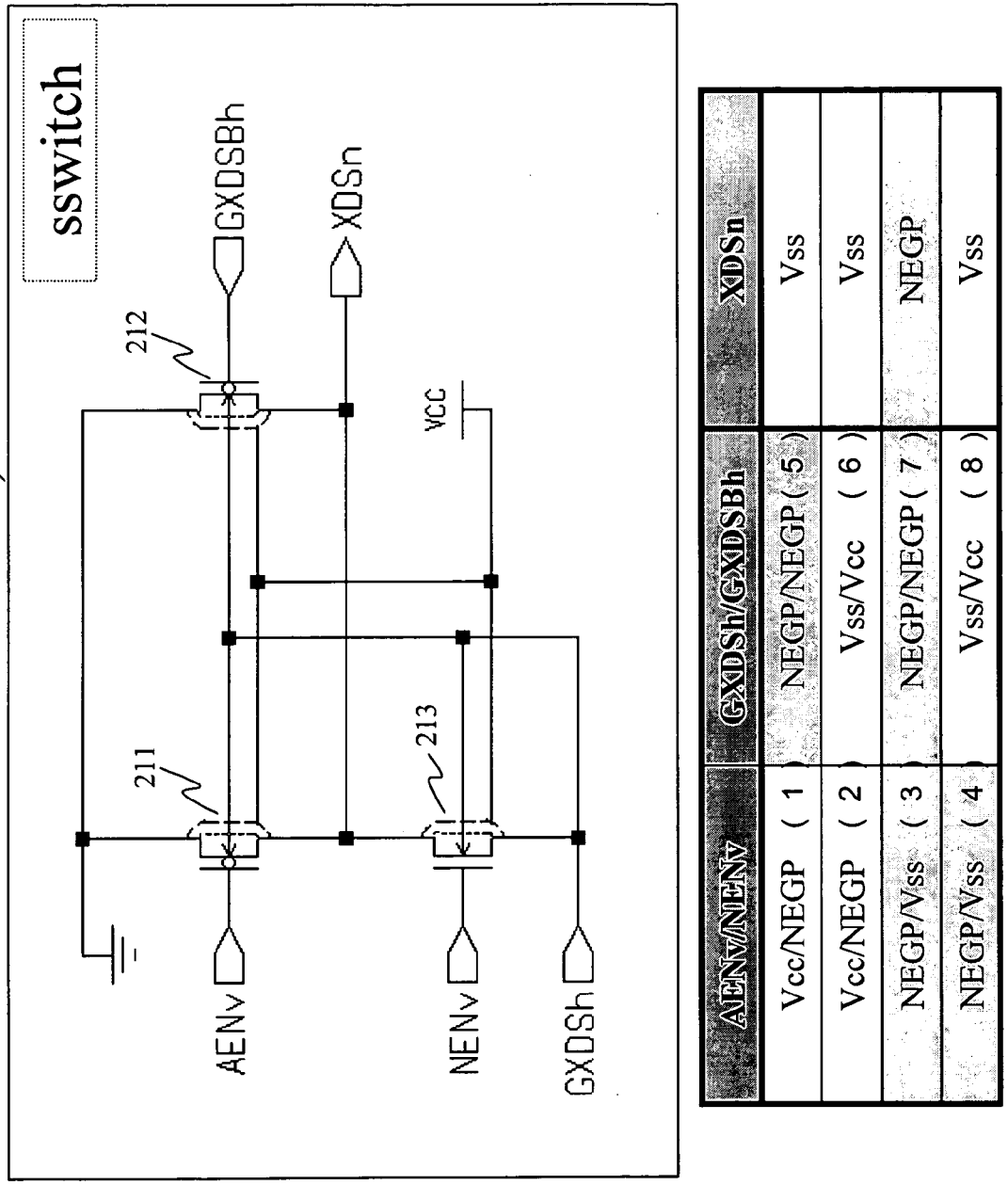
FIG. 15 shows a configuration and operation of a sector switch (sswitch) provided in the semiconductor device shown in FIG. 1.
Figure 16:
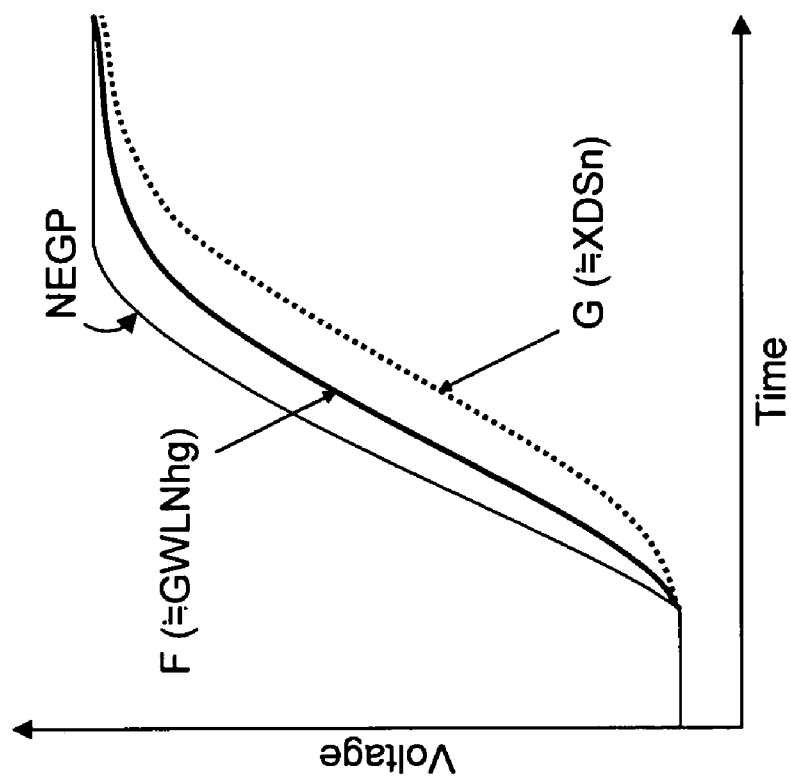
FIG. 16 is a graph explaining discharging a local word line discharging a global word line after erasing.

FIG. 15 is a circuit diagram of the sector switch circuit (sswitch) 210, which has N-channel transistors 211, 212 and 231. FIG. 15 also shows the relationship between the input and output signal lines of the sector switch circuit 210. In the combination of the sector switch select signal lines AENv and NENv, (1) and (2) relate to the unselected case, and (3) and (4) relate to the selected case. In the combination of the voltages of the sector switch control lines GXDSh and GXDSBh, (5) and (7) relate to the selected case, and (6) and (8) relate to the unselected case. As shown, the signal line XDSn is set to the voltage NEGP in the case where AENv/NENv=NEGP/Vss, GXDSh/GXDSBh=NEGP/NEGP, and is set to Vss in the other cases. The signal line XDSn is selectively connected to the local word line P2WLn via the transistor 243 as is shown in FIG. 3, and sets the local word line P2WLn of the sector selected at the time of erasing to the negative voltage.

The first embodiment has just been described in detail. The first embodiment is capable of reducing the leakage currents that flow through the local word line decoders 240 shown in FIG. 3 at the time of erasing and programming.

Second Embodiment

A description will now be given of a second embodiment of the present invention. The second embodiment relates to discharging of the local word line P2WLn that is carried out after erasing.

In the local word line decoders 240 shown in FIG. 3, the local word line P2WLn is set to the negative voltage XDSn when the selected sector is erased. Thus, the local word line P2WLn is discharged to return to the Vss level after the erase. The local word line P2WLn is discharged through the transistor 243, the signal line XDSn, the transistor 213 shown in FIG. 15, the selector switch control line GXDSh shown therein, and the transistor 195 of the global sector switch circuit 180 shown in FIG. 10. At that time, the signal line supplied with the negative voltage NEGP (negative voltage pump path) is also discharged simultaneously through the transistors 196 and 195. The global word line GWLNn shown in FIG. 3 is discharged because it is set to the negative voltage at the time of erasing. This discharge is carried out via the transistor 145 of the global word line decoder 140 shown in FIG. 6. The sector switch control dine GXDSh output from the global sector switch circuit 180 is connected to the source of the transistor 145, and the global world line GWLNh is discharged via the transistor 145, the sector switch control line GXDSh and the transistor 195 shown in FIG. 10.

Since the load on the global word line GWLNh is much smaller than that on the local word line P2WLn, the global word line GWLNh is discharged more quickly than the local word line P2WLn (in other words, charged up to Vss). Thus, the transistor 242 shown in FIG. 3 is turned ON and the vertical word line VWLv happens to be biased to the negative voltage. Then, in the transistor 347 of the vertical word line decoder 340 shown in FIG. 13, the voltage (negative voltage) of the N-channel region (connected to VWLv) formed in the P-type well is lower than the voltage (=Vss) of the P-type well biased to Vss. In this case, forward biasing takes place. The second embodiment is intended to avoiding the possibility of forward biasing.

Figure 17:
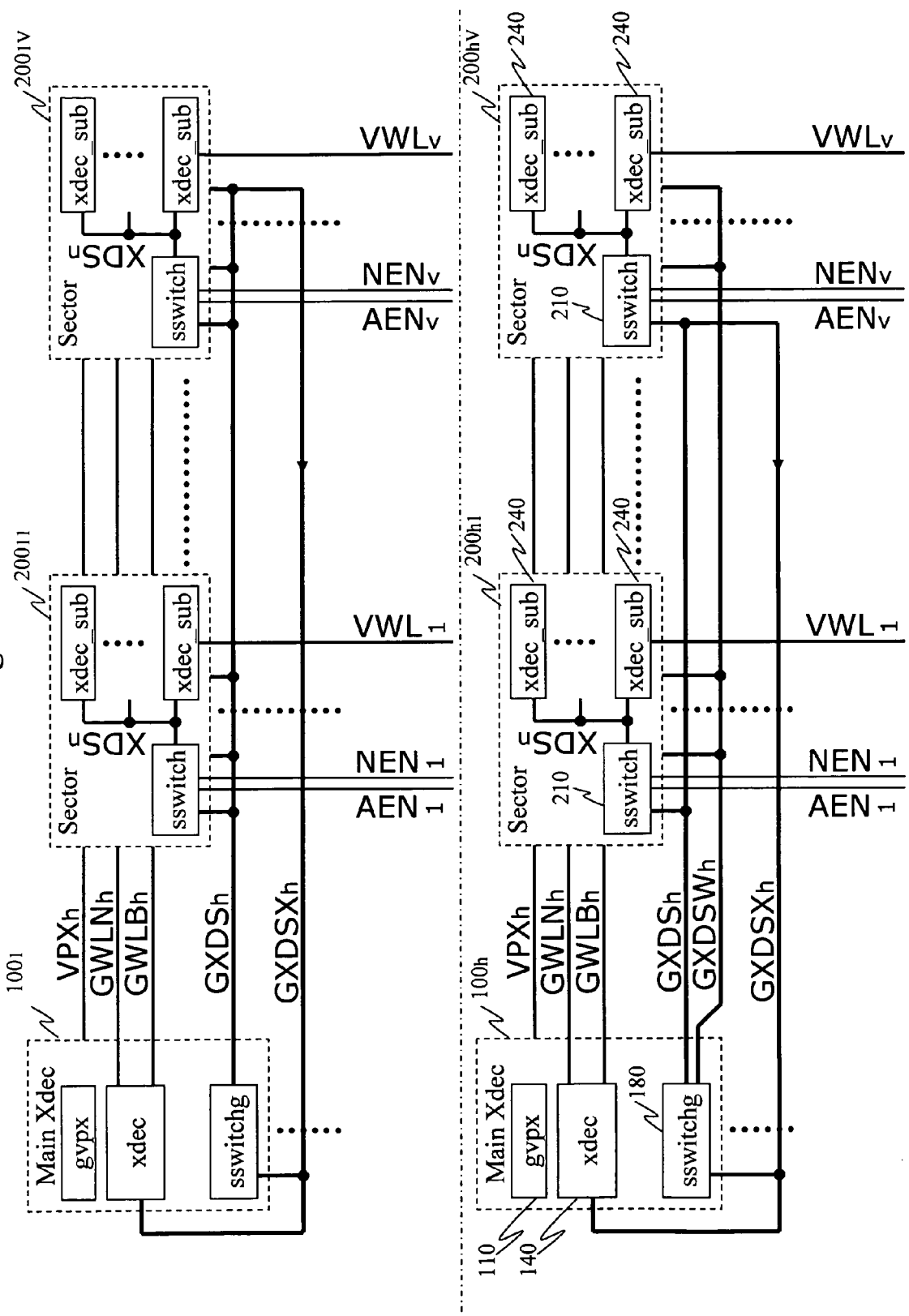
FIG. 17 is a block diagram of the entire structure of a semiconductor device according to a second embodiment.

FIG. 17 shows the entire structure of the second embodiment. As is shown in FIG. 17, the wiring routes that are set to the negative voltage are different from those shown in FIG. 1. The selector switch control line GXDSh extending from the global sector switch circuit 180 is connected to the sector switch 210 of the first column to the sector switch 210 of the vth column in that order, and further extend, as a wiring line GXDSXh serving as a dummy wiring line, from the farthest sector switch 210 to the global sector switch 180 and the global word line decoder 140.

The wiring line GXDSXh is connected to the source of the transistor 145 of the global word line decoder 140 shown in FIG. 6. Thus, the global word line GWLNh having the relatively low load is connected to the wiring line GXDSXh via the line P2WLn having the relatively large load, and is discharged via the line GXDSXh. Thus, the transistor 145 follows the discharge of the local word line P2WLn, and thus prevents the transistor 242 from turning ON.

Figure 18:
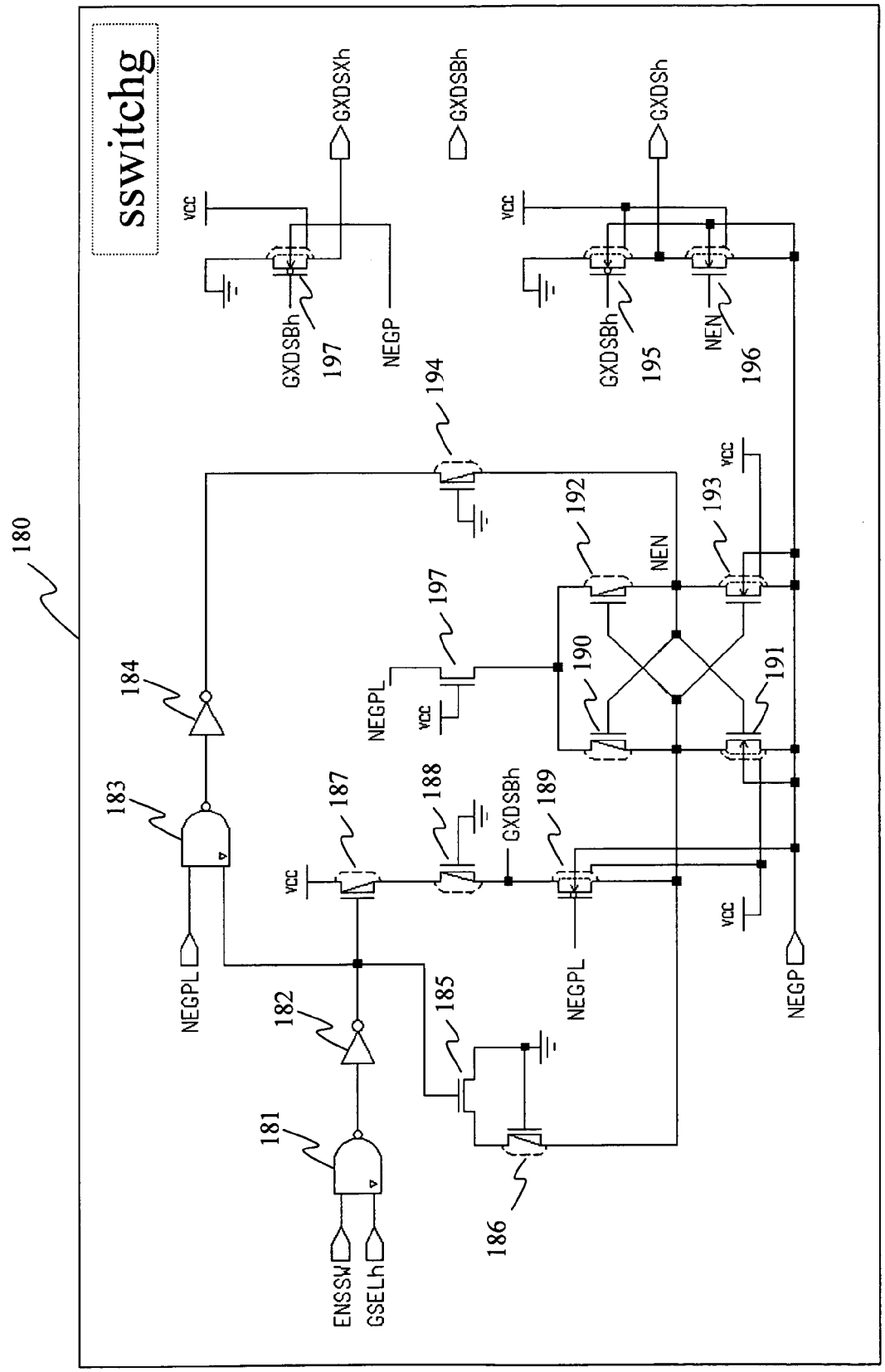
FIG. 18 is a circuit diagram of a global sector switch circuit in the horizontal direction used in the second embodiment.

FIG. 18 is a circuit diagram of the global sector switch circuit 180 used in the second embodiment. The same reference numerals as those shown in FIG. 10 refer to the same structural elements as those shown therein. As shown in FIG. 18, an N-channel transistor 197 is newly provided. The selector switch control line GXDSh connected to an intermediate node between the transistors 195 and 196 passes through the sectors in turn, and is connected to the transistor 197 via the wiring line GXDSXh. The transistor 197 is turned ON/OFF by the selector switch control line GXDSBh connected to the drain of the transistor 189, and is set to the high level in cases other than erasing. The biasing of the global word line GWLNh is carried out in the order of GXDSh, GXDSXh and GWLNh. Thus, it is possible to prevent the transistor 242 from turning ON due to coupling in boosting the VPXh gate by means of the transistor 197 in the unselected local word line decoders 240 in the sector selected at the time of reading/programming.

Figure 19:
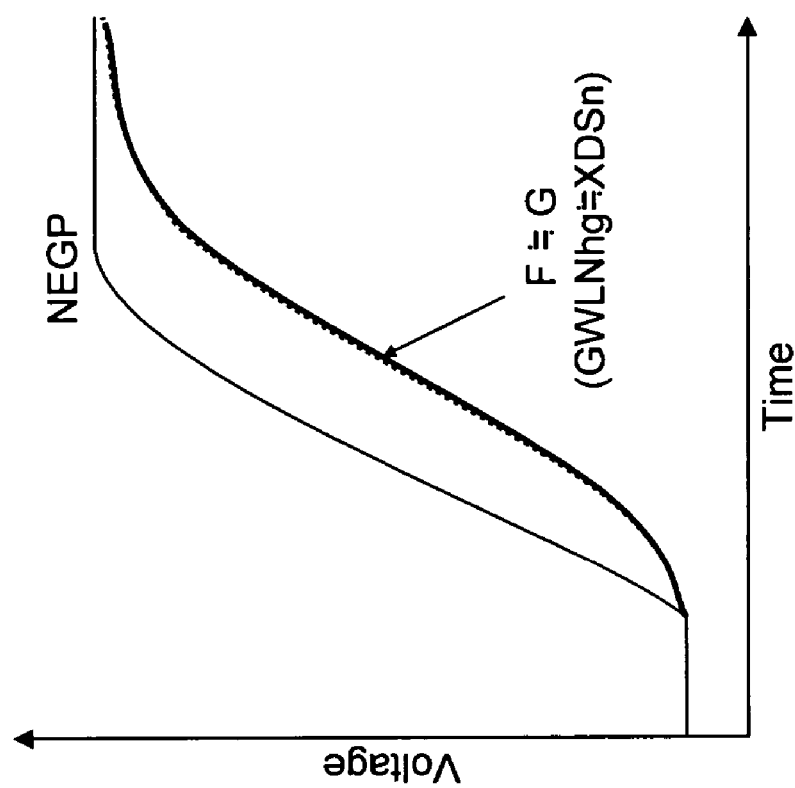
FIG. 19 is a graph explaining discharging the local word line and discharging the global word line after erasing in the second embodiment.

FIG. 19 shows the discharge operation of the second embodiment. Nodes F and G shown in FIG. 3 are substantially simultaneously discharged (to Vss).

In FIG. 17, a sector switch control line GXDSWh is used to bias the P-type wells of the transistors and is provided separate from GXDSh for driving the local word line P2WLn. The line GXDSWh is intended to reduce the load on the wiring line GXDSh.

As described above, the second embodiment is capable of canceling the timing difference between the discharge of the local world lines and the discharge of the global word line.

Figure 20:
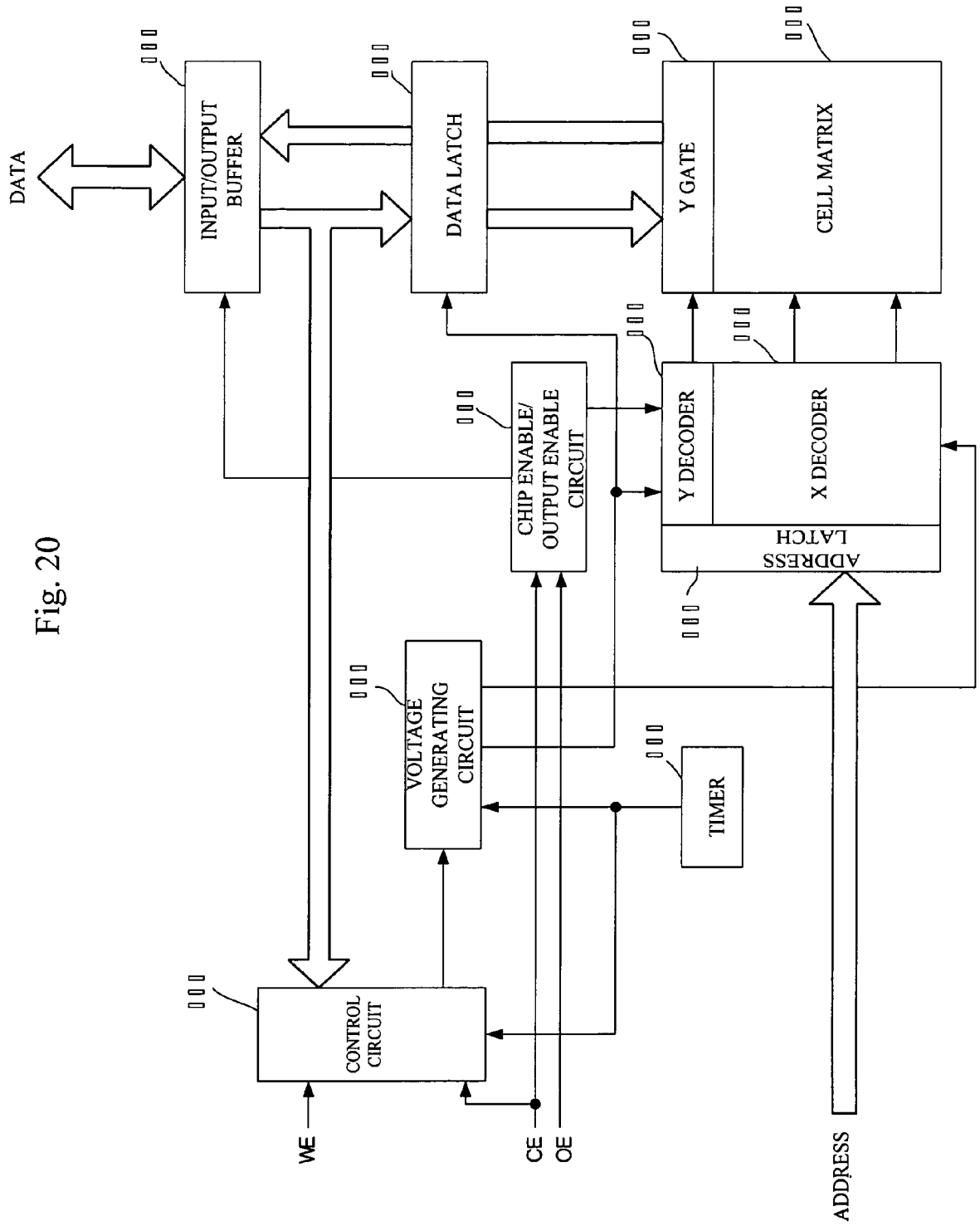
FIG. 20 is a block diagram of an entire structure of the semiconductor device according to the present invention.

FIG. 20 is a block diagram of a flash memory that is an embodiment of the semiconductor device according to the present invention. The flash memory is equipped with a control circuit 520, a voltage generating circuit 522, a timer 524, an address latch 526, a Y decoder 528, an X decoder 530, a Y gate 532, a cell matrix 534, a chip enable/output enable circuit 535, a data latch 538 and an input/output buffer 540.

The control circuit 520 has a built-in command register, and operates in synchronism with a chip enable signal CE and a write enable signal WE externally supplied. The control circuit 520 generates timing signals based on commands externally supplied via the input/output buffer 540, and supplies these timing signals to associates parts. The control circuit 520 generates the aforementioned various control signals in response to a command input. The voltage generating circuit 522 corresponds to the voltage generating circuit 540 shown in FIG. 1. The timer 524 generates clocks and timing signals internally used. The address latch 526 latches an address externally supplied, and supplies the latched address to the Y decoder 528 and the X decoder 530. The Y decoder 528 corresponds to the column decoders $300_1$-$300_v$ shown in FIG. 1. The X decoder 530 corresponds to the main decoders $100_1$-$100_v$ shown in FIG. 1. The chip enable/output enable circuit 536 activates the Y decoder 528 in response to the chip enable signal CE, and activates the input/output buffer 540 in response to the output enable signal OE. Data read from the cell matrix 534 is output to the outside of the flash memory via the Y gate 532, the data latch 538 and the input/output buffer 540. Write data externally supplied is written into the selected memory cell in the cell matrix 534 via the input/output buffer 540, the data latch 538 and the Y gate 532.

The embodiments of the prevent invention have been described. The present invention is not limited to the above-mentioned embodiments but include other embodiments and variations thereof. The semiconductor device of the present invention includes not only a memory alone such as the flash memory but also a system having a built-in flash memory.

What is claimed is:

1. A semiconductor device comprising:
   sectors having memory cells connected to local word lines;
   decoders selecting the sectors; and
   a circuit generating, in erasing of a selected sector, a control signal that causes a corresponding one of the decoders associated with the selected sector to be temporarily unselected.

2. The semiconductor device as claimed in claim 1, wherein:
   each of the sectors comprises a pull-up transistor that is driven by a corresponding one of the decoders via a corresponding one of global word lines connecting the sectors and drives one of the local word lines; and
   the pull-up transistor is kept OFF by the control signal.

3. The semiconductor device as claimed in claim 1, wherein the circuit generates the control signal that keeps the corresponding one of the decoders unselected in an initial stage of erasing.

4. The semiconductor device as claimed in claim 1, wherein the circuit generates the control signal that keeps the corresponding one of the decoders unselected until a negative pump path connected to the corresponding one of the decoders unselected falls to a given intermediate negative voltage in erasing.

5. The semiconductor device as claimed in claim 1, wherein:
   each of the sectors comprises a pull-up transistor and a pull-down transistor for driving one of the local word lines, both transistors being driven by a corresponding one of the decoders; and the control signal disabling a path including the pull-up and pull-down transistors for a given period of time in erasing.

6. The semiconductor device as claimed in claim 1, wherein the memory cells are non-volatile memory cells.

7. A method of controlling a semiconductor device comprising the steps of:

selecting one of sectors having memory cells connected to local word lines; and generating, in erasing of a selected sector, a control signal that causes a decoder for selectively driving the selected sector to be temporarily unselected.

* * * * *